(12) United States Patent
Yaegashi

(10) Patent No.: US 8,134,200 B2
(45) Date of Patent: Mar. 13, 2012

(54) NONVOLATILE SEMICONDUCTOR MEMORY INCLUDING A GATE INSULATING FILM AND AN INTER-GATE INSULATING FILM

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 12/331,869

(22) Filed: Dec. 10, 2008

(65) Prior Publication Data

US 2009/0173989 A1 Jul. 9, 2009

(30) Foreign Application Priority Data

Dec. 21, 2007 (JP) ................................. 2007-331048

(51) Int. Cl.
*H01L 29/51* (2006.01)
(52) U.S. Cl. ................ 257/320; 257/324; 257/E29.309; 257/E29.165; 257/E29.17; 257/68; 257/71; 257/296; 257/309; 257/314; 257/326
(58) Field of Classification Search .................. 257/320, 257/324, E29.309, E29.165, E29.17, 68, 257/71, 296, 309, 314, 326
See application file for complete search history.

(56) References Cited

U.S. PATENT DOCUMENTS

| | | | | |
|---|---|---|---|---|
| 2002/0093073 A1* | 7/2002 | Mori et al. | ..................... | 257/510 |
| 2004/0007734 A1* | 1/2004 | Kato et al. | ..................... | 257/324 |
| 2005/0090052 A1* | 4/2005 | Matsui et al. | .................. | 438/222 |
| 2005/0205920 A1* | 9/2005 | Jeon et al. | ..................... | 257/310 |
| 2006/0258090 A1* | 11/2006 | Bhattacharyya et al. | ...... | 438/257 |
| 2006/0261401 A1* | 11/2006 | Bhattacharyya | .............. | 257/316 |
| 2007/0026608 A1* | 2/2007 | Choi et al. | ..................... | 438/257 |
| 2007/0215929 A1* | 9/2007 | Yasuda | ......................... | 257/314 |
| 2007/0221985 A1* | 9/2007 | Yamazaki et al. | ............. | 257/315 |
| 2007/0241388 A1* | 10/2007 | Yamamoto et al. | ........... | 257/314 |
| 2008/0067576 A1 | 3/2008 | Yaegashi | | |
| 2010/0038704 A1 | 2/2010 | Yaegashi | | |

FOREIGN PATENT DOCUMENTS

JP 9-213783 8/1997

(Continued)

OTHER PUBLICATIONS

Office Action issued Aug. 31, 2010, in Korean Patent Application No. 10-2008-130423 (with English language translation).
Office Action issued Nov. 25, 2010 in Korea Application No. 10-2008-130423.

(Continued)

*Primary Examiner* — Marc Armand
(74) *Attorney, Agent, or Firm* — Oblon, Spivak, McClelland, Maier & Neustadt, L.L.P.

(57) ABSTRACT

A nonvolatile semiconductor memory of an aspect of the present invention includes a memory cell including, a charge storage layer on a gate insulating film, a multilayer insulator on the charge storage layer, and a control gate electrode on the multilayer insulator, the gate insulating film including a first tunnel film, a first high-dielectric-constant film on the first tunnel film and offering a greater dielectric constant than the first tunnel film, and a second tunnel film on the first high-dielectric-constant film and having the same configuration as that of the first tunnel film, the multilayer insulator including a first insulating film, a second high-dielectric-constant film on the first insulating film and offering a greater dielectric constant than the first insulating film, and a second insulating film on the second high-dielectric-constant film and having the same configuration as that of the first insulating film.

21 Claims, 26 Drawing Sheets

X-direction

FOREIGN PATENT DOCUMENTS

| | | |
|---|---|---|
| JP | 2003-188356 | 7/2003 |
| JP | 2007-12922 | 1/2007 |
| JP | 2007-194483 | 8/2007 |
| JP | 2007-294082 | 11/2007 |
| KR | 1998-16785 | 6/1998 |

OTHER PUBLICATIONS

Office Action issued Aug. 31, 2010, in Korean Patent Application No. 10-2008-130423 (with English language translation).

Office Action issued Nov. 25, 2010 in Korea Application No. 10-2008-130423 (With English Abstract).

* cited by examiner

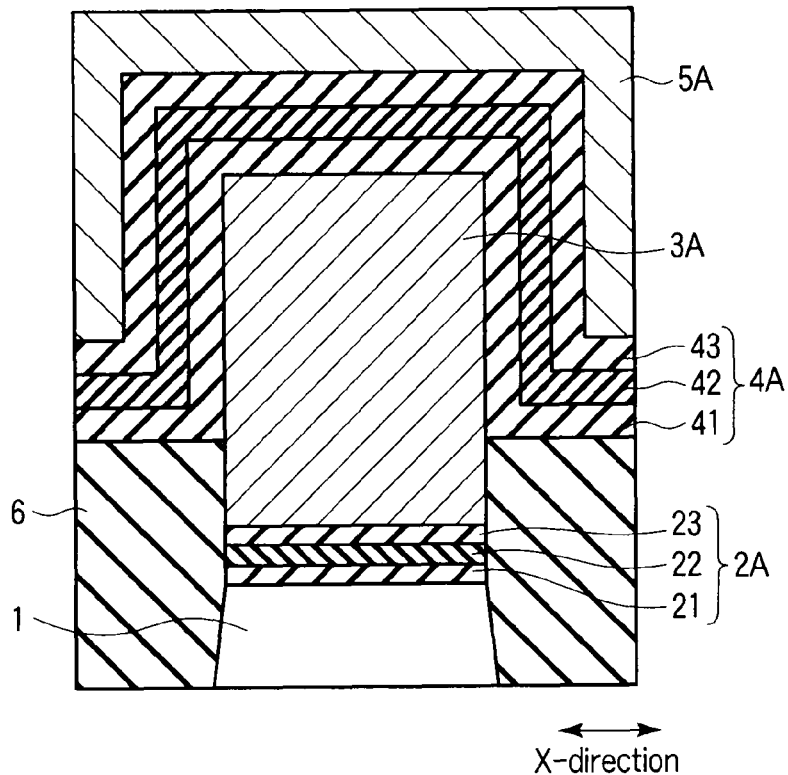
F I G. 4
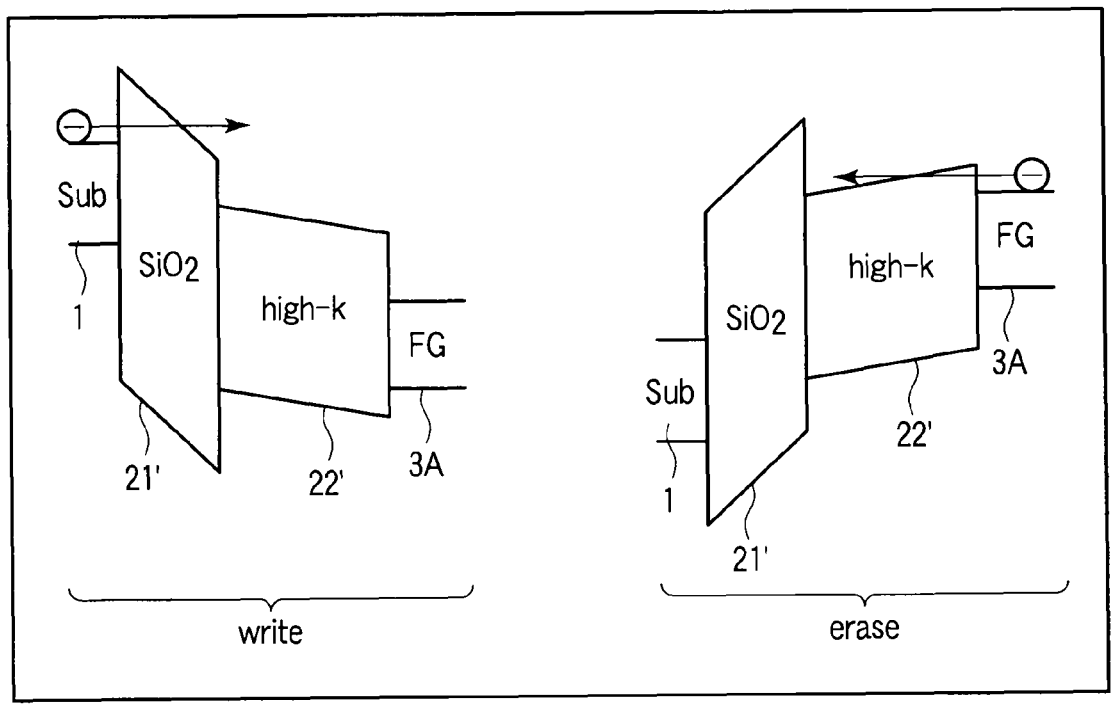
F I G. 5

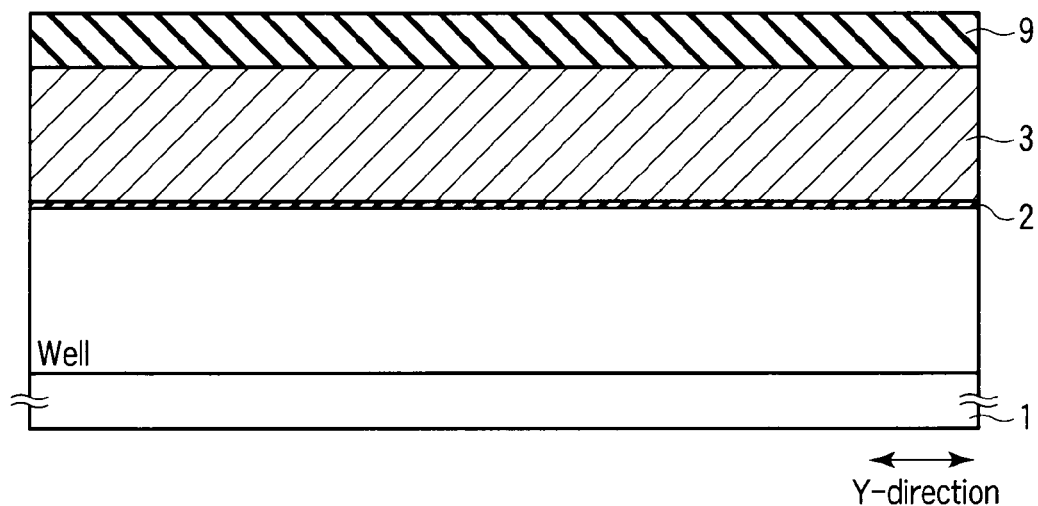
F I G. 8
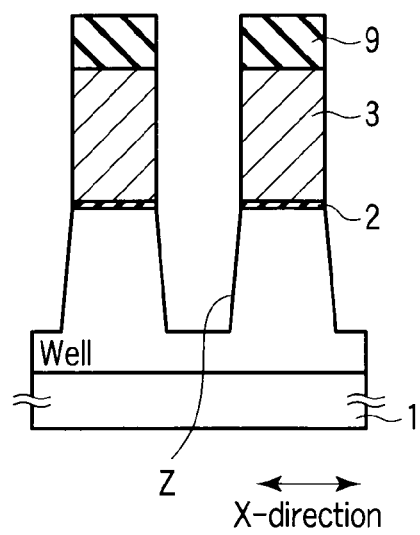
F I G. 9

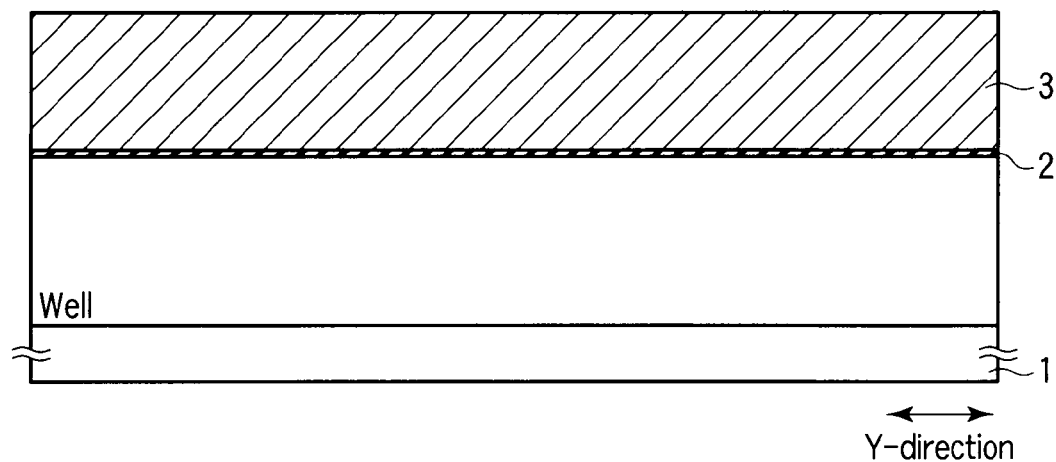
F I G. 10
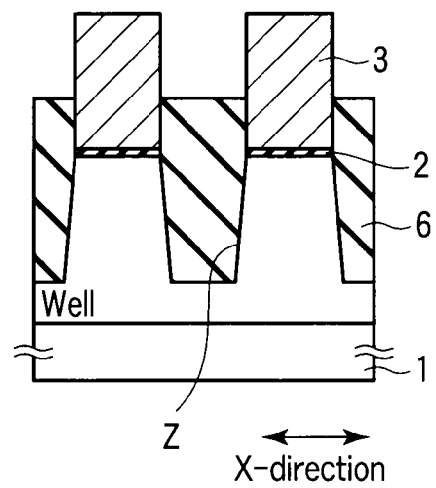
F I G. 11

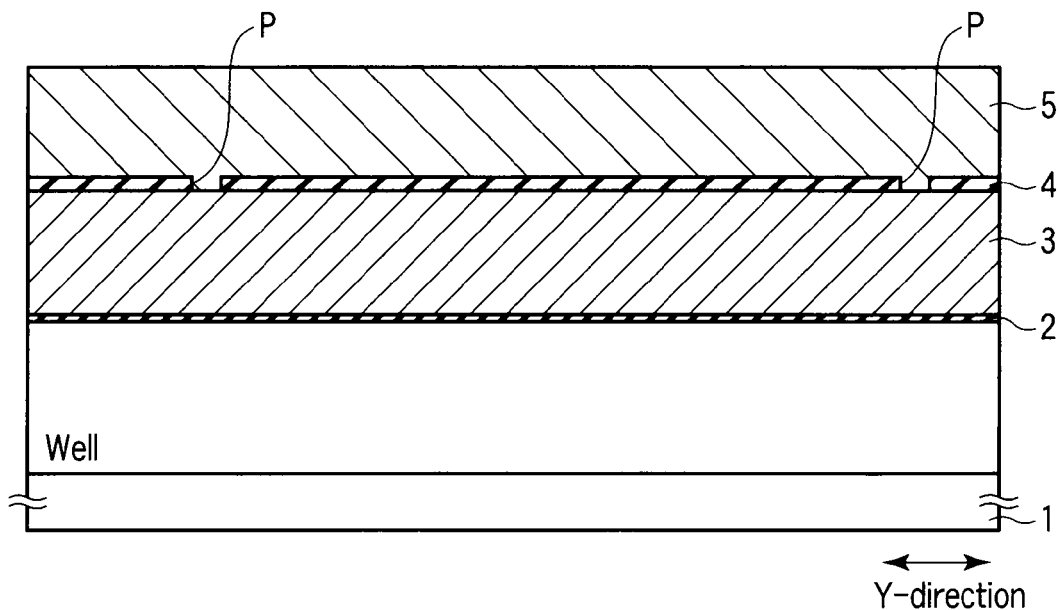
F I G. 1 2
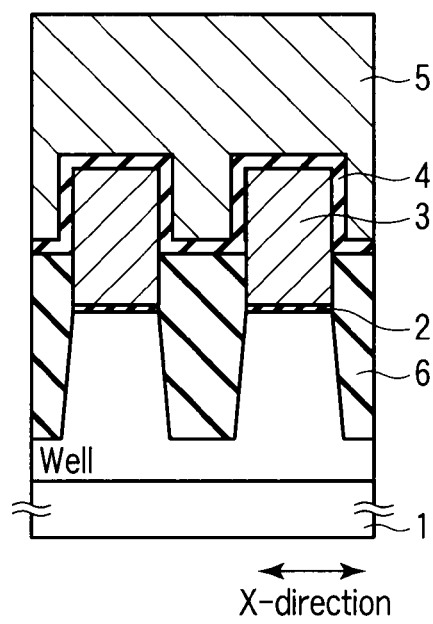
F I G. 1 3

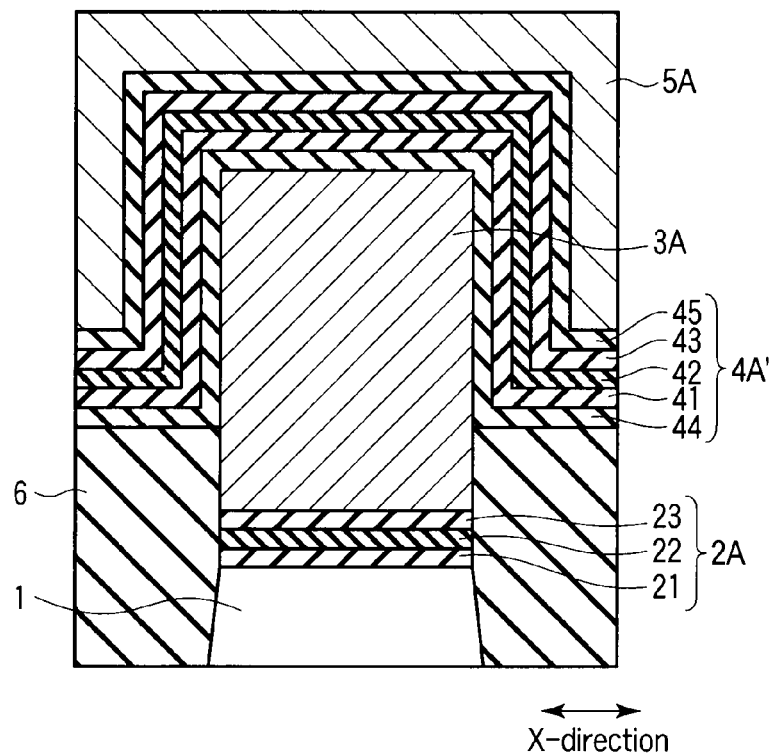
F I G. 14
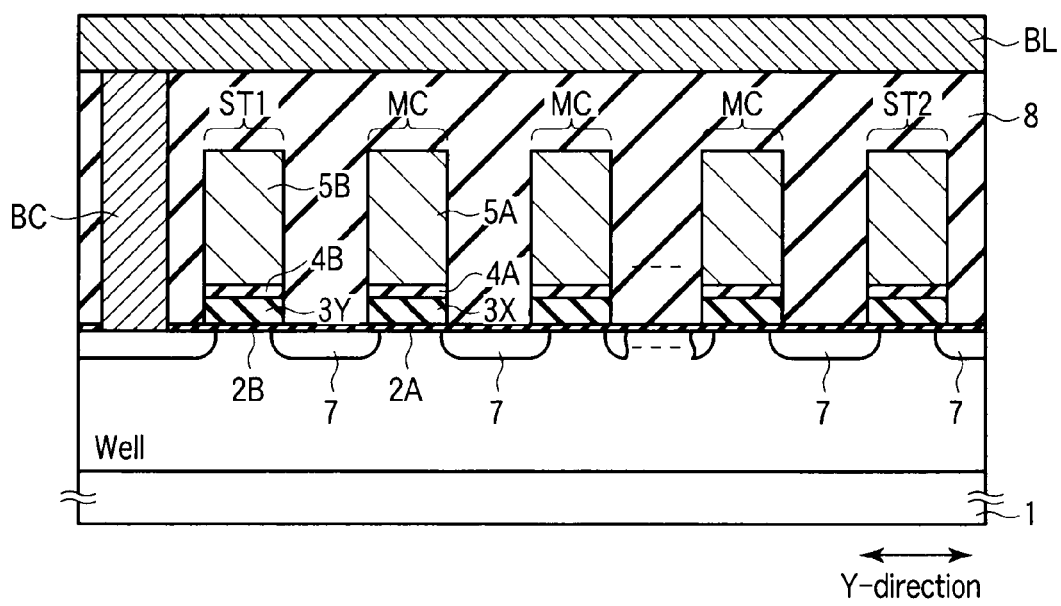
F I G. 15

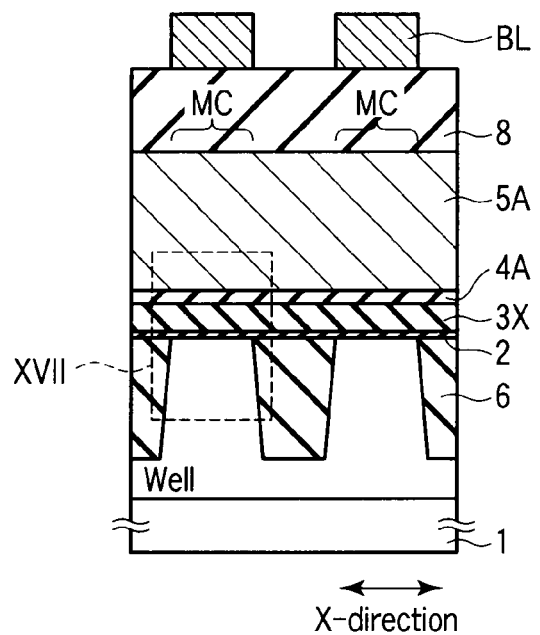
F I G. 1 6
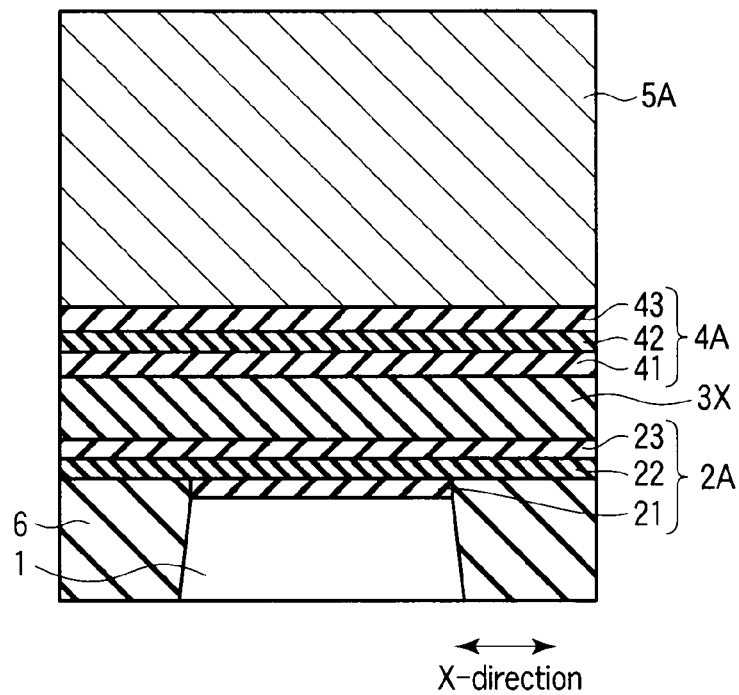
F I G. 1 7

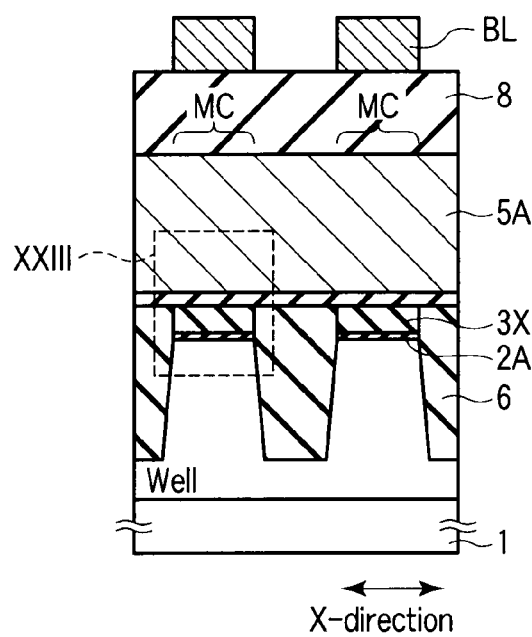
F I G. 2 2
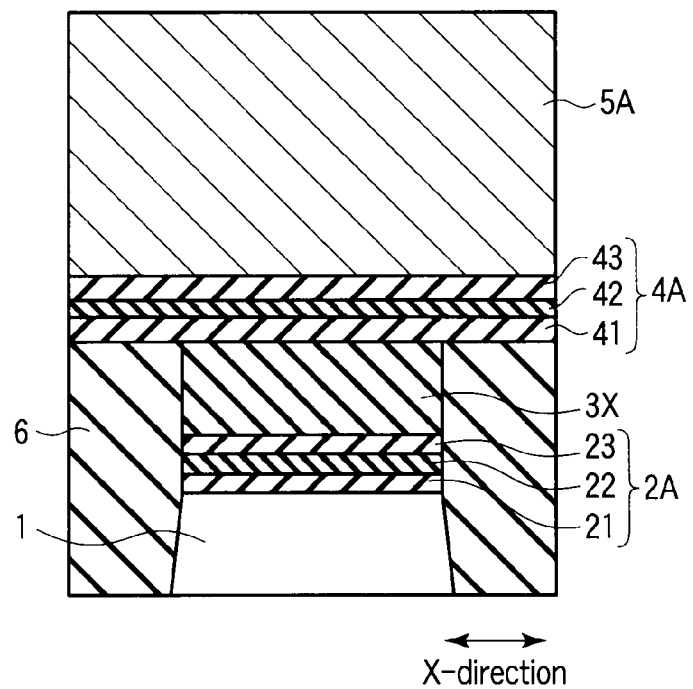
F I G. 2 3

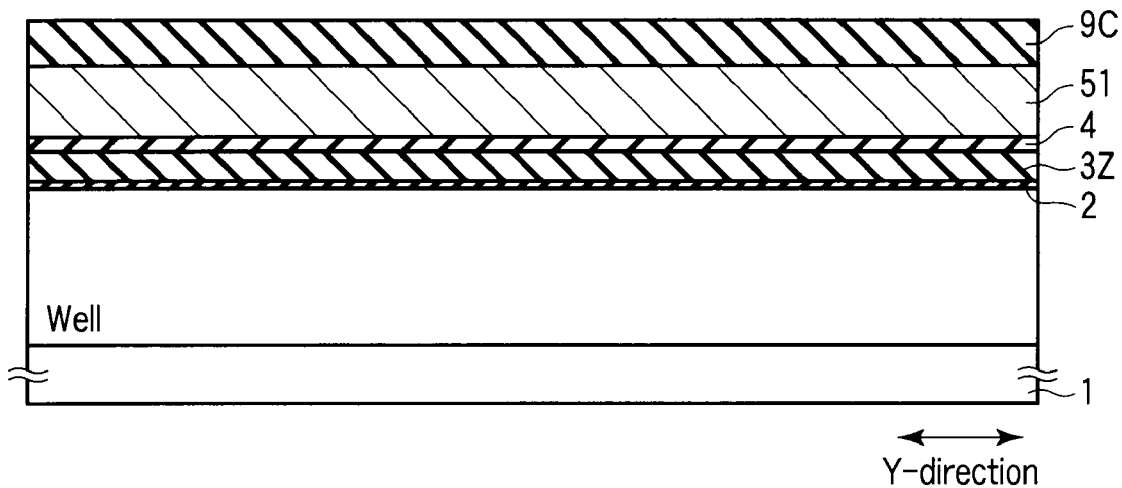
F I G. 2 8
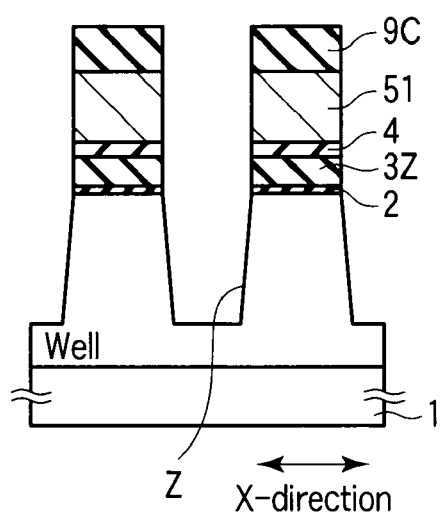
F I G. 2 9

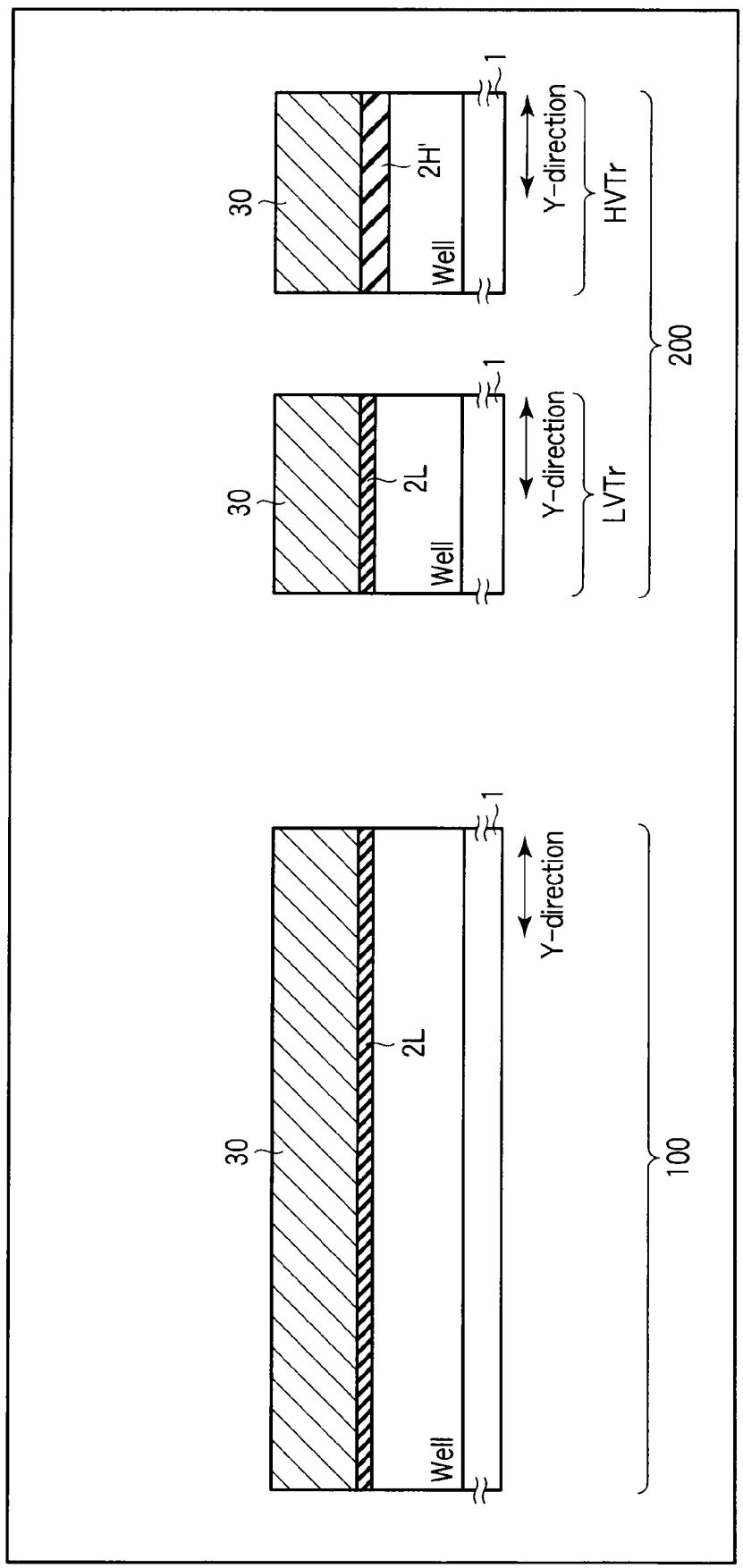
F I G. 38

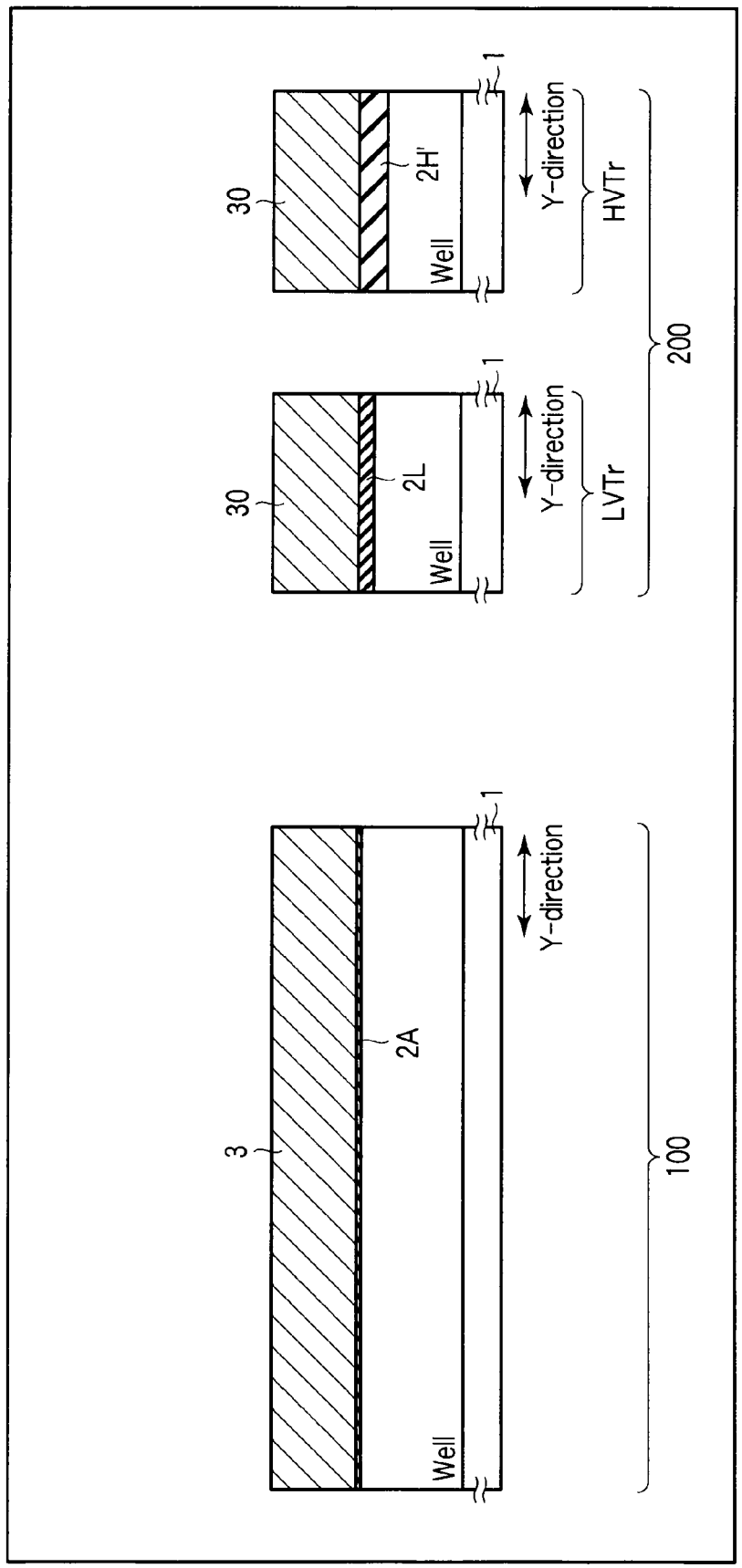
F I G. 40

NONVOLATILE SEMICONDUCTOR MEMORY INCLUDING A GATE INSULATING FILM AND AN INTER-GATE INSULATING FILM

CROSS-REFERENCE TO RELATED APPLICATIONS

This application is based upon and claims the benefit of priority from prior Japanese Patent Application No. 2007-331048, filed Dec. 21, 2007, the entire contents of which are incorporated herein by reference.

BACKGROUND OF THE INVENTION

1. Field of the Invention

The present invention relates to a nonvolatile semiconductor memory, and in particular, to a structure of a gate insulating film and an inter-gate insulating film in a memory cell.

2. Description of the Related Art

Nonvolatile semiconductor memories, for example, flash memories, are mounted in various electronic apparatuses. Memory cells in a flash memory each have a gate electrode structure in which a charge storage layer and a control gate electrode are stacked on a gate insulating film (tunnel insulating film) on a surface of a semiconductor substrate (channel region) via an inter-gate insulating film.

In the memory cell configured as described above, for example, a thermal oxide film of thickness approximate 8 nm is used as a gate insulating film. A laminated film (ONO film) of thickness approximate 15 nm made up of a silicon oxide film, a silicon nitride film, and a silicon oxide film as an inter-gate insulating film. A floating gate electrode made up of polycrystalline silicon is used as a charge storage layer. A top surface of the floating gate electrode and side surfaces of the floating gate electrode in a channel width direction are covered with the control gate electrode via the inter-gate insulating film. Thus, the opposed area between the floating gate and the control gate is increased to ensure a proper coupling ratio of the memory cell.

Efforts have been made to miniaturize memory cells to increase memory capacity. There has been a demand for a reduction in a write/erase voltage of the memory cell. However, when an attempt is made to reduce the thickness of a tunnel insulating film and thus an operating voltage, leakage characteristics of the tunnel insulating film at a low electric field may disadvantageously be degraded. As a result, data retention characteristics of the memory cell may be degraded.

An effective alternative method for reducing the write/erase voltage is to increase the coupling ratio. However, the reduced thickness of the inter-gate insulating film may degrade the leakage characteristics of the inter-gate insulating film. Thus, as is the case with the reduced thickness of the tunnel insulating film, the data retention characteristics of the memory cell may be degraded.

When the miniaturized memory cell prevents the side surfaces of the floating gate electrode from being covered with the control gate electrode, the control gate electrode can contact the floating gate electrode only at the top surface. This reduces the coupling ratio. Similarly, if an insulating film with a high trap level, such as a silicon nitride film, is used as a charge storage layer, as in the case of metal-oxide-nitride-oxide-semiconductor (MONOS) memory cells, the coupling ratio is low because the control gate electrode contacts the charge storage layer (silicon nitride film) at the top surface.

Disadvantageously, the reduced coupling ratio of the memory cell increases the write/erase voltage, and when an attempt is made to solve this problem by reducing the thicknesses of the tunnel insulating film and the block insulating film, the data retention characteristics of the memory cell may be degraded as described above.

Jpn. Pat. Appln. KOKAI Publication No. 2003-188356 discloses a technique intended mainly to improve the data retention characteristics of MFMIS memory cells utilizing polarization of a ferroelectric substance and in which a gate insulating film in the memory cell has a two-layer structure made up of a high-dielectric film and a tunnel insulating film to inhibit a possible leakage current and to improve charge retention characteristics. Jpn. Pat. Appln. KOKAI Publication No. 2007-12922 discloses a structure in which a gate insulating film in a memory cell is made up of the gate insulating film on a surface of a semiconductor substrate and a very thin high-dielectric film on the gate insulating film.

BRIEF SUMMARY OF THE INVENTION

A nonvolatile semiconductor memory of an aspect of the present invention comprises a memory cell including an element region partitioned by an isolation region in a semiconductor substrate, a first gate insulting film provided on the element region, a charge storage layer provided on the gate insulating film, a multilayer insulator provided on the charge storage layer, and a control gate electrode provided on the multilayer insulator, the gate insulating film including a first tunnel film, a first high-dielectric-constant film provided on the first tunnel film and offering a greater dielectric constant than the first tunnel film, and a second tunnel film provided on the first high-dielectric-constant film and having the same configuration as that of the first tunnel film, the multilayer insulator including a first insulating film, a second high-dielectric-constant film provided on the first insulating film and offering a greater dielectric constant than the first insulating film, and a second insulating film provided on the second high-dielectric-constant film and having the same configuration as that of the first insulating film.

BRIEF DESCRIPTION OF THE SEVERAL VIEWS OF THE DRAWING

FIG. 4 is an enlarged view showing a structure of a gate insulating film and a multilayer insulator according to the first embodiment;

FIG. 5 is a schematic diagram showing an energy band of a gate insulating film;

FIG. 8 is a diagram showing a step of a method of manufacturing a nonvolatile semiconductor memory according to a first embodiment;

FIG. 9 is a diagram showing a step of the method of manufacturing the nonvolatile semiconductor memory according to the first embodiment;

FIG. 10 is a diagram showing a step of the method of manufacturing the nonvolatile semiconductor memory according to the first embodiment;

FIG. 11 is a diagram showing a step of the method of manufacturing the nonvolatile semiconductor memory according to the first embodiment;

FIG. 12 is a diagram showing a step of the method of manufacturing the nonvolatile semiconductor memory according to the first embodiment;

FIG. 13 is a diagram showing a step of the method of manufacturing the nonvolatile semiconductor memory according to the first embodiment;

FIG. 14 is an enlarged view showing a structure of a gate insulating film and a multilayer insulator according to a second embodiment;

FIG. 15 is a sectional view of a nonvolatile semiconductor memory according to a third embodiment taken along line II-II in FIG. 1;

FIG. 16 is a sectional view of the nonvolatile semiconductor memory according to the third embodiment taken along line III-III in FIG. 1;

FIG. 17 is an enlarged view showing a structure of a gate insulating film and a multilayer insulator according to a third embodiment;

FIG. 22 is a sectional view of the nonvolatile semiconductor memory according to the third embodiment taken along line III-III in FIG. 1;

FIG. 23 is an enlarged view showing a structure of a gate insulating film and a multilayer insulator according to a third embodiment;

FIG. 28 is a diagram showing a step of the method of manufacturing the nonvolatile semiconductor memory according to the third embodiment;

FIG. 29 is a diagram showing a step of the method of manufacturing the nonvolatile semiconductor memory according to the third embodiment;

FIG. 38 is a diagram illustrating the manufacturing method in the second applied example;

FIG. 40 is a diagram illustrating the manufacturing method in the second applied example.

DETAILED DESCRIPTION OF THE INVENTION

Aspects in which examples of the present invention are carried out will be described below in detail with reference to the drawings.

1. OUTLINE

Embodiments of the present invention relate to a nonvolatile semiconductor memory.

In the nonvolatile semiconductor memory according to the present embodiment, a memory cell includes a gate insulating film of a multilayer structure, and an insulating film of a multilayer structure (hereinafter referred to as a multilayer insulator) between a charge storage layer and a control gate electrode. In the embodiments of the present invention, the multilayer insulator is referred to as an inter-gate insulating film in a memory cell including a floating gate electrode as a charge storage layer. On the other hand, the multilayer insulator is referred to as a block insulating film in a memory cell including an insulating film with a high trap density as a charge storage layer.

A gate insulating film of a multilayer structure includes a first tunnel film, a second tunnel film, and a high-dielectric film sandwiched between the two tunnel films. The multilayer insulator includes a first insulating film, a second insulating film, and second a high-dielectric film sandwiched between the two insulating films.

According to the embodiments of the present invention, the gate insulating film uses the multilayer structure made up of the thin tunnel insulating film and the high-dielectric-constant film. This reduces the operating voltage of the memory cell and inhibits possible leakage current. The use of the multilayer insulator inhibits possible leakage current between the charge storage layer and the control gate electrode and improves charge retention characteristics of the memory cell. Moreover, the reduced operating voltage and the inhibited possible leakage current allow the multilayer insulator to be thinned, improving the coupling ratio of the memory cell. The improved coupling ratio reduced the driving voltage.

2. EMBODIMENTS (1) First Embodiment

A nonvolatile semiconductor memory according to a first embodiment of the present invention will be described below with reference to FIGS. 1 to 13.

(a) Structure

Figure 1:
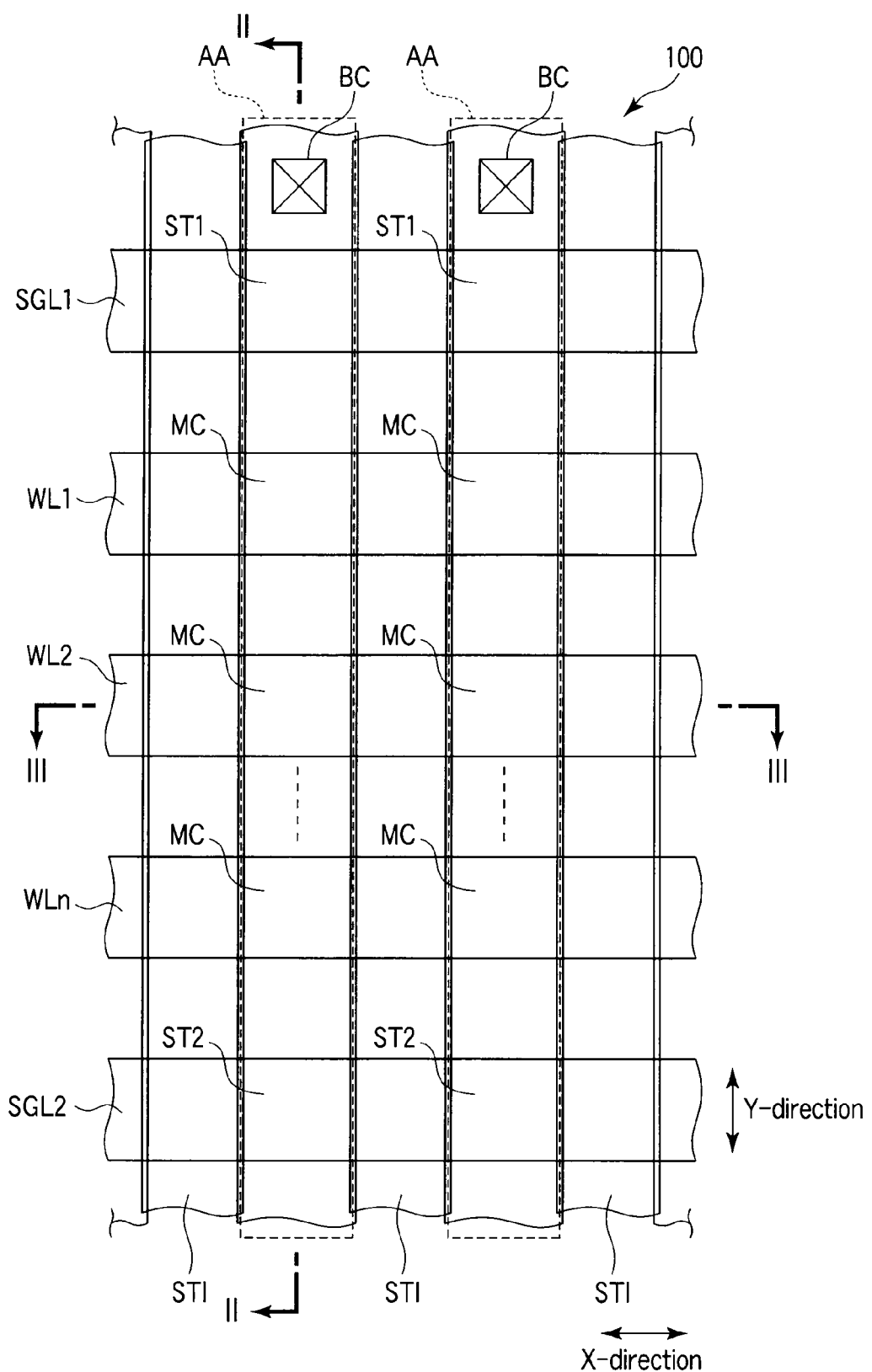
FIG. 1 is a plan view showing a structure of a memory cell array according to an embodiment of the present invention.
Figure 2:
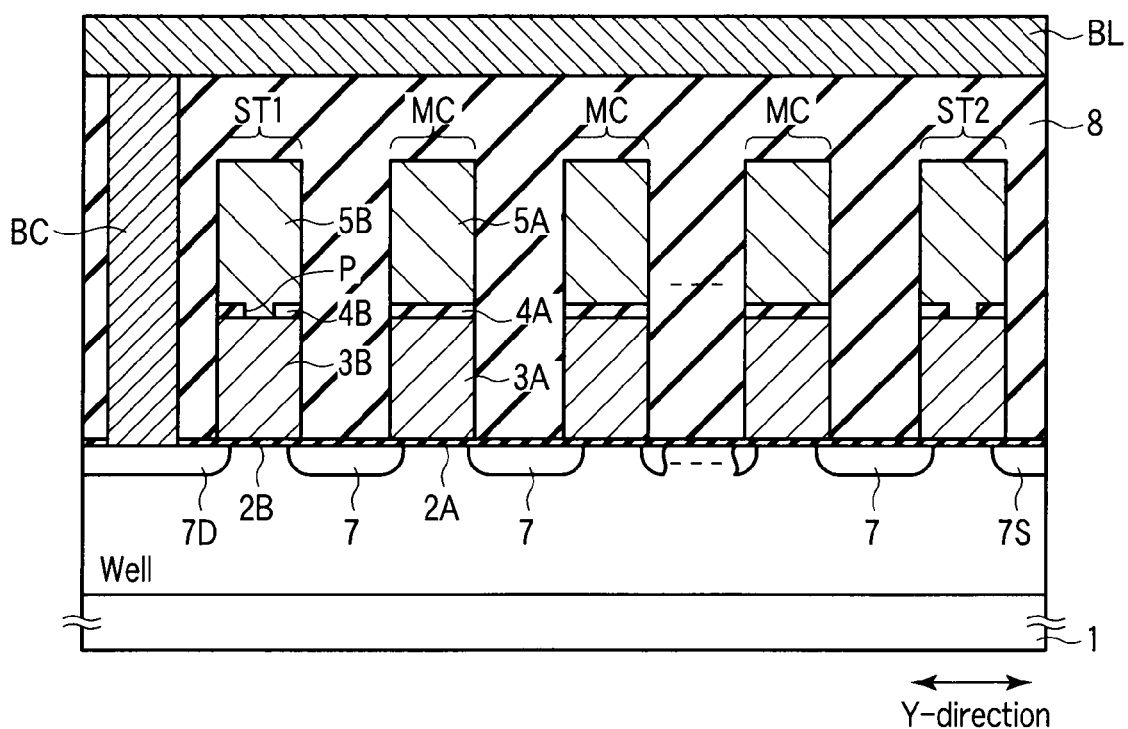
FIG. 2 is a sectional view of a nonvolatile semiconductor memory according to a first embodiment taken along line II-II in FIG. 1.
Figure 3:
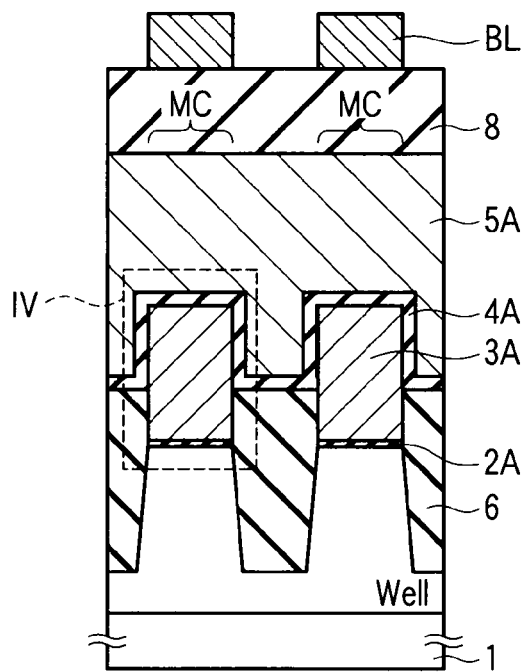
FIG. 3 is a sectional view of the nonvolatile semiconductor memory according to the first embodiment taken along line III-III in FIG. 1.

The structure of the nonvolatile semiconductor memory according to the first embodiment of the present invention will be described below with reference to FIGS. 1 to 4. FIG. 1 is a plan view of a memory cell array 100 in a flash memory illustrated as a nonvolatile semiconductor memory according to a first embodiment. FIG. 2 is a sectional view taken along line II-II in FIG. 2. FIG. 3 is a sectional view taken along line III-III in FIG. 1.

As shown in FIG. 1, in the memory cell array 100 in the flash memory, a semiconductor substrate surface region is composed of isolation regions STI and element regions (active regions) AA each sandwiched between two isolation regions arranged adjacent to each other in an X-direction. The isolation regions STI and the element regions AA extend in a Y-direction. A plurality of memory cells MC and selection transistors ST1 and ST2 are provided on the element region AA.

In the present embodiment, the plurality of memory cells MC are arranged on the element region AA so as to be connected together in series along the Y-direction orthogonal to the X-direction. The selection transistors ST1 and ST2 are arranged so as to be connected to a one end and an other end, respectively, of the group of the plurality of memory cells MC connected together in series. In the description below, the plurality of memory cells connected together in series are referred to as a NAND string. The NAND string and the selection transistors ST1 and ST2, connected to the first and second ends, respectively, of the NAND string, are collectively referred to as a NAND cell unit.

The plurality of memory cells MC arranged adjacent to one another in the X-direction are connected to one of common word lines WL1 to WLn extending in the X-direction. The selection transistors ST1 to ST2 arranged adjacent to one another in the X-direction are connected to common selection gate lines SGL1 and SGL2, respectively, extending in the X-direction. One bit line extending in the Y-direction is connected to each NAND cell unit via a bit line contact BC.

As shown in FIGS. 2 and 3, a gate structure of the memory cell MC is such that a control gate electrode 5A is laminated on a floating gate electrode 3A via an inter-gate insulating film 4A.

A well region Well is provided in a semiconductor substrate 1 (element region AA) in which the memory cells MC are provided. A gate insulating film 2A is formed on a surface of the semiconductor substrate 1. In the memory cell MC, the gate insulating film 2A functions as a tunnel insulating film. The gate insulating film 2A in the memory cell MC is called the tunnel insulating film 2A.

The floating gate electrode 3A is provided on the tunnel insulating film 2A on a surface of the semiconductor substrate 1. The floating gate electrode 3A functions as a charge storage layer that holds data written to the memory cell. The floating gate electrode 3A is composed of, for example, a polysilicon film.

The inter-gate insulating film 4A is provided on the floating gate electrode 3A. The control gate electrode 5A is provided on the inter-gate insulating film 4A. The control gate electrode 5A has a two-layer structure (polycide structure) including, for example, a polysilicon film and a silicide film laminated on the polysilicon film in order to reduce electric resistance. However, the present invention is not limited to this aspect. The control gate electrode 5A may have a single layer structure of a polysilicon film or a silicide film. The silicide film may be, for example, a tungsten silicide film ($WSi_2$), a molybdenum silicide film ($MoSi_2$), a cobalt silicide film ($CoSi_2$), a titanium silicide film ($TiSi_2$), or a nickel silicide film ($NiSi_2$).

The control gate electrode 5A functions as a word line WL, and is shared by the memory cells arranged adjacent to each other in the X-direction. Thus, the control gate electrode 5A is provided not only on the floating gate electrode 3A but also on an isolation insulating film 6 in an isolation region STI via the inter-gate insulating film 4A.

An upper end of the isolation insulating film 6 is positioned lower than an upper end of the floating gate electrode 3A (closer to the semiconductor substrate). Thus, side surfaces of the floating gate electrode 3A in the X-direction (channel width direction) are covered with the control gate electrode 5A via the inter-gate insulating film 4A. Thus, an opposed surface between the floating gate electrode 3A and the control gate electrode 5A is obtained on not only the top surface but also the side surfaces of the floating gate electrode 3A. This improves the coupling ratio of the memory cell MC.

A diffusion layer 7 is provided in the semiconductor substrate 1. The diffusion layer 7 functions as a source/drain region of the memory cell MC. The diffusion layer 7 is shared by the memory cells MC arranged adjacent to one another in the Y-direction (channel length direction). Thus, the plurality of memory cells MC are connected together in series.

The selection transistors ST1 and ST2 are connected to the first and second ends, respectively, of the group of the plurality of memory cells MC (NAND string) connected together in series.

The selection transistors ST1 and ST2 are formed in the same step in which the memory cells MC are formed. Thus, a gate structure of the selection transistors ST1 and ST2 is such that gate electrodes 3B and 5B are laminated via an inter-gate insulating film 4B as is the case with the memory cell MC. However, in the selection transistors ST1 and ST2, the inter-gate insulating film 4B includes an opening P via which the gate electrode 3B on a gate insulating film 2B is connected to the gate electrode 5B on the inter-gate insulating film 4B. The diffusion layers 7, 7D, and 7S function as source/drain regions of the selection transistors ST1 and ST2 and are shared by the memory cells MC arranged adjacent to the respective selection transistors in the Y-direction. Thus, the plurality of memory cells MC and the selection transistors ST1 and ST2 are connected together in series in the Y-direction to make up one NAND cell unit.

In the NAND cell unit, the diffusion layer 7D of selection transistor ST1, which is positioned on a drain side of the NAND string, is connected to a bit line BL via a bit line contact section BC buried in an interlayer insulating film 8. The diffusion layer 7S of selection transistor ST2, which is positioned on a source side of the NAND string, is connected to a source line (not shown in the drawings) via a source line contact (not shown in the drawings) buried in the interlayer insulating film 8.

FIG. 4 is an enlarged diagram of a region VI enclosed by a dashed line in FIG. 3, more specifically showing the structure of the tunnel insulating film 2A and the inter-gate insulating film 4A. As shown in FIG. 4, in the first embodiment of the present invention, the memory cell MC in the flash memory is characterized in that the tunnel insulating film (gate insulating film) 2A and the inter-gate insulating film (multilayer insulator) 4A have respective multilayer structures.

The tunnel insulating film 2A of the multilayer structure according to the present embodiment has a three-layer structure made up of, for example, a silicon oxide film 21, a high-dielectric film 22, and a silicon oxide film 23. The film thickness of the silicon oxide film (first tunnel film) 21 and the silicon oxide film (second tunnel film) 23 is such that, for example, carriers (electrons) perform direct tunneling through the tunnel film. A film thickness of the first and second tunnel film 21 and 23 is preferably at least 1 nm and at most 2.5 nm. The high-dielectric insulating film (first high-dielectric film) has, for example, an alumina film ($Al_2O_3$). A film thickness of the high-dielectric insulating film is, for example, at least 2 nm and at most 3 nm. The high-dielectric insulating film is not limited to the $Al_2O_3$ film and has only to be an insulating film with a greater dielectric constant than the silicon oxide film. The high-dielectric insulating film may be, for example, a hafnium oxide film ($HfO_2$), a tantalum oxide film ($Ta_2O_3$), or a lanthanum oxide film ($La_2O_3$), or a compound film containing any of these high-dielectric materials. An oxide film as the high-dielectric material may contain silicon or nitrogen.

Figure 6:
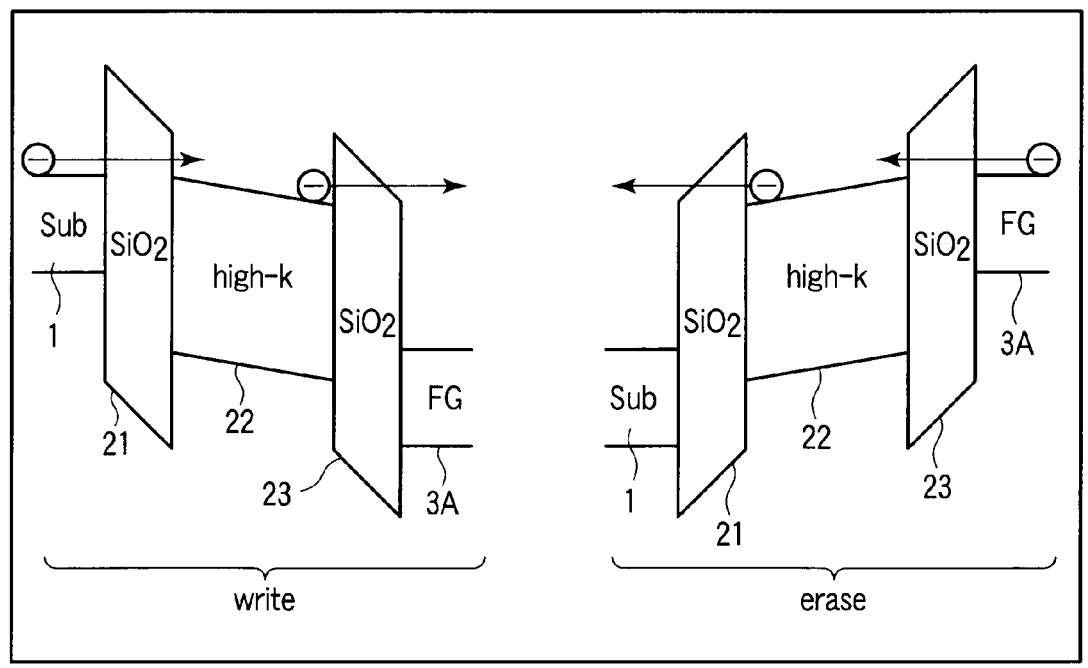
FIG. 6 is a schematic diagram showing the energy band of the gate insulating film.

Now, with reference to FIGS. 5 and 6, description will be given of the effects and operation of the gate insulating film (tunnel insulating film) of the multilayer structure according to the first embodiment of the present invention. FIG. 5 schematically shows, as a reference example, an energy band of a tunnel oxide film of a two-layer structure made up of a silicon oxide film and a high-dielectric insulating film. FIG. 6 shows an energy band of a tunnel oxide film of a three-layer structure according to the embodiment of the present invention. In the example described below, the material of the high-dielectric insulating film is such that the potential barrier height of the high-dielectric insulating film is lower than that of the silicon oxide film, and is, for example, an $Al_2O_3$ film.

In the example of the tunnel insulating film shown in FIG. 5, during a write operation, the semiconductor substrate 1 side is a carrier (electron) injection side. The floating gate electrode 3A side is a carrier emission side. When a write voltage is applied to a gate electrode of the memory cell, a potential barrier of a silicon oxide film 21' located on the carrier injection side increases, whereas a potential barrier of a high-dielectric insulating film 22' located on the electron emission side decreases. Thus, carriers (electrons) are injected into the floating gate electrode 3A via the silicon oxide film 21' and the high-dielectric insulating film 22' by Fowler-Nordheim (FN) tunneling or direct tunneling.

During an erase operation, the semiconductor substrate 1 side serves as a carrier (electron) emission side. The floating gate electrode 3A side serves as a carrier injection side. When an erase voltage is applied to the gate electrode, a potential barrier of the high-dielectric insulating film 22' located on the carrier injection side increases, whereas a potential barrier of the silicon oxide film 21' located on the electron emission side decreases. In the example shown in FIG. 5, electrons stored in the floating gate electrode 3A pass through the high-dielectric insulating film 22' and then the silicon oxide film 21'. That is, in the reference example, potential energy that is greater than that required for the write operation is required for the erase operation to pass through the thick potential barrier of the high-dielectric insulating film 22', which is in direct contact with the floating gate electrode 3A. Furthermore, tunnel probability decreases to reduce tunnel current. As a result, the erase voltage of the memory cell increases.

In contrast, the tunnel insulating film 2A according to the present embodiment has the three-layer structure in which the high-dielectric insulating film 22 is sandwiched between the silicon oxide films (tunnel films) 21 and 23, as shown in FIG. 6. The tunnel insulating film 2A according to the present embodiment allows the high-dielectric insulating film 22 to serve as a main barrier against the carriers (electrons) storage in the floating gate electrode 3A. Thus, in spite of the reduced thickness of the two silicon oxide films 21 and 23, possible leakage of the electrons can be prevented. Thus, the film thickness of the silicon oxide films 21 and 23 can be such that the electrons perform direct tunneling through the silicon oxide film (for example, 1 to 2.5 nm). Moreover, the presence of the silicon oxide films 21 and 23 allows the high-dielectric insulating film 22 to be thinned, increasing the tunnel current and the coupling ratio.

That is, in the present embodiment, when a high electric field is applied to the tunnel insulating film 2A during the write operation on the memory cell, the direct tunneling causes the electrons to pass through the silicon oxide films 21 and 23 and the high-dielectric insulating film 22 and to be injected into the floating gate electrode 3A. Thus, compared to the FN tunneling, which requires a high electric field, the direct tunneling increases the tunnel probability and thus the tunnel current flowing through the tunnel insulating film 2A. As a result, the write voltage for the memory cell can be reduced.

As shown in FIG. 6, during the erase operation on the memory cell according to the present embodiment, the electrons stored in the floating gate electrode 3A pass through the silicon oxide film 23 by direct tunneling. After the direct tunneling, the electrons pass through the high-dielectric insulating film 22 and the silicon oxide film 21 and are emitted into the semiconductor substrate 1. Thus, since also during erasure, the electrons are emitted by direct tunneling, the erase operation on the flash memory can be performed at an erase voltage lower than that in the example shown in FIG. 5.

Furthermore, when a low electric field is applied to the tunnel insulating film 2A, for example, during the read operation on the flash memory or boost-up of a channel region, not only the two silicon oxide films 21 and 23 but also the high-dielectric insulating film 22 serves as a potential barrier to reduce leakage current flowing through the tunnel insulating film 2A. As a result, the charge retention characteristics of the memory cell can be improved.

In the first embodiment of the present invention, the inter-gate insulating film (multilayer insulator) 4A of the multilayer structure has a three-layer structure made up of, for example, a silicon oxide film 41, a high-dielectric insulating film 42, and a silicon oxide film 43. In the present embodiment, the order of lamination in the inter-gate insulating film 4A is such that for example, the configuration of the inter-gate insulating film 4A is the same as that of the tunnel oxide film 2A. The film thickness of the silicon oxide film (first insulating film) 41 and silicon oxide film (second insulating film) 43 in the inter-gate insulating film 4A is, for example, at least 3 nm and at most 5 nm. The high-dielectric insulating film (second high-dielectric insulating film) 42 is made up of, for example, an $Al_2O_3$ film. The film thickness of the high-dielectric insulating film 42 is, for example, at least 4 nm and at most 5 nm. The high-dielectric insulating film 42 is not limited to the $Al_2O_3$ film. Like the high-dielectric insulating film 22, used in the gate insulating film 2A, the high-dielectric insulating film may be made up of a high-dielectric material such as $HfO_2$ or a compound film containing such a high-dielectric material.

Figure 7:
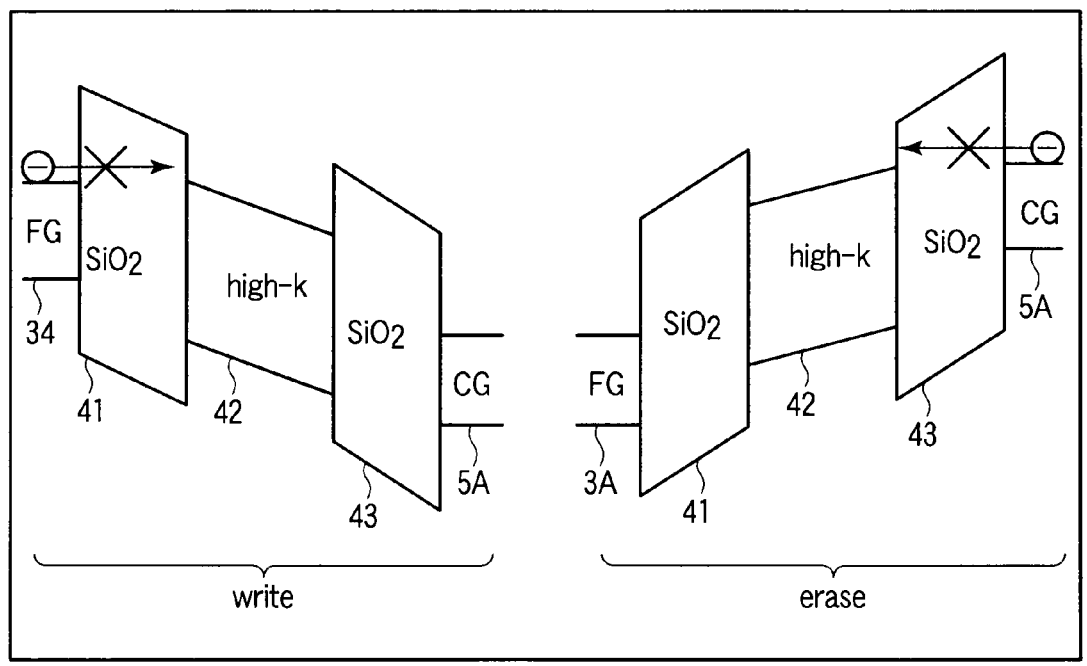
FIG. 7 is a schematic diagram showing an energy band of an inter-gate insulating film.

Now, with reference to FIG. 7, the effects and operation of the inter-gate insulating film (multilayer insulator) 4A will be described. FIG. 7 shows an energy band of the inter-gate insulating film 4A of the multilayer structure.

The film thickness of the silicon oxide films 41 and 43, used in the inter-gate insulating film 4A, is greater than that of the silicon oxide films 21 and 23, used in the tunnel insulating film 2A. As is the case with the tunnel insulating film 2A, the high-dielectric insulating film 42 is interposed between the two silicon oxide films 41 and 43. Thus, during the write operation, the possible tunneling of the electrons in the inter-gate insulating film 4A is inhibited. The electrons accumulated in the floating gate electrode 3A can thus be prevented from passing through the inter-gate insulating film 4A and being then emitted to the control gate electrode 5A. Similarly, also during the erase operation, the possible tunneling of the electrons in the inter-gate insulating film 4A is inhibited. The electrons can thus be prevented from passing through the inter-gate insulating film 4A and being then injected from the control gate electrode 5A into the floating gate electrode 3A.

Thus, the inter-gate insulating film 4A has the multilayer structure including the silicon oxide films 41 and 43 and the high-dielectric insulating film 42. Thus, compared to the use of an ONO film, this structure increases the dielectric constant of the inter-gate insulating film 4A and reduces the leakage current flowing through the inter-gate insulating film 4A. Consequently, the charge retention characteristics of the memory cell can be improved.

Additionally, the tunnel insulating film 2A configured as described above reduces the leakage current and driving voltage. The thus reduced voltage allows the inter-gate insulating film 4A to be thinned. Thus, the use of the high-dielectric insulating film 42 and the reduced thickness of the inter-gate insulating film (multilayer insulator) 4A increase the coupling ratio of the memory cell and thus increase the electric field applied to the tunnel insulating film 2A. As a result, the write voltage can be further reduced.

As described above, driving characteristics of the memory cell can be improved by the gate insulating film 2A and the inter-gate insulating film 4A both of the multilayer structure.

Therefore, the first embodiment of the present invention reduces the driving voltage of the memory cell and the leakage current. Thus, the inter-gate insulating film (multilayer insulator) can be thinned, improving the coupling ratio of the memory cell. The improved coupling ratio further reduces the driving voltage of the memory cell.

The configuration of the insulating films 21 to 23 and 41 to 43, making up the tunnel insulating film 2A and the inter-gate insulating film 4A, respectively, is not limited to the above-described materials and film thicknesses. For example, the film thickness and material of the high-dielectric insulating film 22 of the tunnel oxide film 2A may differ from those of the high-dielectric insulating film 42 of the inter-gate insulating film 4A. For example, the coupling ratio of the memory cell can be improved by forming the high-dielectric insulating film 22 using an $Al_2O_3$ film and forming the high-dielectric insulating film 42 using an $HfAlO_x$ film, which offers a greater dielectric constant than the $Al_2O_3$ film. In this case, the possible leakage current from the inter-gate insulating film 4A can further be reduced. This allows the film thickness of the silicon oxide films 41 and 43 of the inter-gate insulating film 4A to be made the same as that of the silicon oxide film 21 and 23 of the tunnel insulating film 2A. Thus, the inter-gate insulating film 4A can be further thinned.

(b) Manufacturing Method.

Now, an example of a method of manufacturing a nonvolatile semiconductor memory according to the first embodiment of the present invention will be described with reference to FIGS. 2 to 4 and 8 to 13. FIGS. 8, 10, and 12 show a manufacturing step for a cross section of the semiconductor memory taken along line II-II in FIG. 1, that is, along the Y-direction (channel length direction). FIGS. 9, 11, and 13 show a manufacturing step for a cross section of the semiconductor memory taken along line III-III in FIG. 1, that is, along the X-direction (channel width direction).

As shown in FIGS. 8 and 9, the well region Well is formed in the semiconductor substrate (for example, the silicon substrate) 1 by ion implantation. A gate insulating film 2 for the memory cells and the selection transistors is formed on the surface of the semiconductor substrate 1.

The gate insulating film 2 has, for example, a three-layer structure in which the silicon oxide film 21, the high-dielectric insulating film 22, and the silicon oxide film 23 are sequentially formed as shown in FIG. 4. The silicon oxide film 21 is formed on the surface of the semiconductor substrate 1, for example, to a thickness of at least approximately 1 nm and at most approximately 2.5 nm using thermal oxidation. As the high-dielectric insulating film 22, the $Al_2O_3$ film is formed on the silicon oxide film 21, for example, to a thickness of at least approximately 2 nm and at most approximately 3 nm using the atomic layer deposition (ALD) method. The silicon oxide film 23 is formed on the $Al_2O_3$ film 22 to a thickness of at least approximately 1 nm and at most approximately 2.5 nm using the chemical vapor deposition (CVD) method.

Then, a polysilicon film 3 serving as floating gate electrodes (charge storage layers) of the memory cells and the gate electrodes of the selection transistors is formed on the gate insulating film 2 of the multilayer structure by, for example, the CVD method. Furthermore, a silicon nitride film 9 is formed on the polysilicon film 3. The silicon nitride film 9 serves as a mask layer for etching when a trench serving as an isolation region is formed.

Then, the silicon nitride film 9 is patterned by a photolithography technique so as to form an element region of a predetermined size. Based on the pattern, the silicon nitride film 9, the polysilicon layer 3, the gate insulating film 2, and the semiconductor substrate 1 are sequentially etched by, for example, the reactive ion etching (RIE) method. Thus, a trench Z is formed in the semiconductor substrate 1.

Then, for example, a silicon oxide film is formed all over the surface of the semiconductor substrate 1. The silicon oxide film is then subjected to a flattening process by the chemical mechanical polishing (CMP) method using the silicon nitride film 9 as a stopper. As shown in FIGS. 10 and 11, the isolation insulating film 6 is formed in the trench Z to form the element region, in which the memory cell is to be formed, and the isolation region, which defines the element region.

The isolation insulating film 6 is etched by, for example, the RIE method so that an upper end of the isolation insulating film 6 is lower than an upper end of the polysilicon film 3. Then, side surfaces of the polysilicon film 3 in the X-direction (channel width direction) are exposed. Thereafter, the silicon nitride film is removed.

As shown in FIGS. 12 and 13, an insulator 4 serving as an inter-gate insulating film (multilayer insulator) is formed on the polysilicon film 3 and the isolation insulating film 6. Here, as shown in FIG. 4, the insulator 4 is formed by, for example, sequentially laminating the silicon oxide film 41, the high-dielectric insulating film 42, and the silicon oxide film 43. The silicon oxide film 41 is formed on the polysilicon film 3 to a thickness of at least approximately 3 nm and at most approximately 5 nm using, for example, the CVD method or the thermal oxidation. The high-dielectric insulating film (for example, the $Al_2O_3$ film) 42 is formed on the silicon oxide film 41 to a thickness of at least approximately 4 nm and at most approximately 5 nm by, for example, the ALD method. The silicon oxide film 43 is formed on the $Al_2O_3$ film 42 to a thickness of at least approximately 3 nm and at most approximately 5 nm using, for example, the CVD method.

Then, in a planned selection transistor formation region, a part of the insulator 4 is removed to form the opening P in the insulator 4. A polycide film 5 serving as control gate electrodes of memory cells and the gate electrodes of the selection transistors is formed on the insulator 4. In this case, in the planned selection transistor formation region, the opening P is formed in the insulator 4, the polysilicon film 3 and the polycide film 5 directly contact each other via the opening P. The control gate electrode is not limited to the polycide film but may be a single layer structure of a polysilicon film or a silicide film.

The polycide film 5 is patterned by the photolithography technique, and the polycide film 5, the insulator 4, and the polysilicon film 3 are sequentially etched. As shown in FIGS. 2 to 4, the following are formed on the gate insulating films 2A and 2B: the floating gate electrodes 3A and control gate electrodes 5A of the memory cells MC, the gate electrodes 3B and 5B of the selection transistors ST1 and ST2, and the inter-gate insulating films (multilayer insulators) 4A and 4B of the memory cells MC and both the selection transistors ST1 and ST2, respectively.

Then, for example, a thin oxide film (not shown in the drawings) is formed on side surfaces of the gate electrodes by the thermal oxidation method. The diffusion layers 7, 7D, and 7S, serving as source/drain regions of the memory cells MC and the selection transistors ST1 and ST2, are then formed in the semiconductor substrate 1 through the formed gate electrodes as a mask in a self-aligning manner.

The interlayer insulating film 8 is formed on the semiconductor substrate 1 by the CVD method so as to cover the gate electrodes of the memory cells MC and the selection transistors ST1 and ST2. The bit line contact BC and the source line contact (not shown in the drawings) are then buried in the interlayer insulating film 8 so as to be connected to the diffusion layers 7D and 7S, respectively. The bit line BL and the source line (not shown in the drawings) are formed so as to be connected to the bit line contact BC and the source line contact, respectively. The above-described steps complete the flash memory according to the present embodiment.

As described above, in the memory cell according to the present embodiment, the gate insulating film 2A of the multilayer structure and the inter-gate insulating film (multilayer insulator) 4A of the multilayer structure are formed.

Therefore, the method of manufacturing the nonvolatile semiconductor according to the first embodiment of the present invention allows provision of a memory cell which reduces the driving voltage and possible leakage current, and which thus allows the inter-gate insulating film (multilayer insulator) to be thinned to increase the coupling ratio of the memory cell.

(2) Second Embodiment

A nonvolatile semiconductor memory according to a second embodiment of the present invention will be described with reference to FIG. 14. The nonvolatile semiconductor memory according to the present embodiment is a flash memory as is the case with the first embodiment. Thus, the basic configuration of the memory cell is similar to that shown in FIGS. 1 to 3 and will not be described below. In FIG. 14, the same members as those in FIGS. 1 to 3 are denoted by the same reference numerals and will not be described below in detail.

FIG. 14 is an enlarged view of the gate insulating film (tunnel insulating film) 2A and an inter-gate insulating film (multilayer insulator) 4A' in the memory cell according to the second embodiment of the present invention.

In the example described in the first embodiment, the inter-gate insulating film 4A has the three-layer structure of the silicon oxide film 41, the high-dielectric insulating film 42, and the silicon oxide film 43.

On the other hand, the second embodiment is characterized in that an inter-gate insulating film 4A' is made up of insulating films of a five-layer structure, for example, a silicon nitride film 44, the silicon oxide film 41, the high-dielectric insulating film 42, the silicon oxide film 43, and a silicon nitride film 45 and in that the silicon nitride film 44 is interposed between the floating gate electrode 3A and the silicon oxide film 41 and the silicon nitride film 45 is interposed between the control gate electrode 5A and the silicon oxide film 43. The insulating films 41, 42, and 43, sandwiched between the two silicon nitride film 44 and 45, have the same configuration as that of, for example, the gate insulating film 2A.

In the present embodiment, the silicon nitride film 44, which is in contact with the floating gate electrode 3A, is, for example, at least 1 nm and at most 2 nm. The film thickness of the silicon oxide films 41 and 43 is, for example, at least 2 nm and at most 3 nm. The film thickness of the high-dielectric insulating film (for example, the $Al_2O_3$ film) 42 is at least 3 nm and at most 5 nm. The silicon nitride film 45, which is in contact with the control gate electrode 5A, is, for example, approximately 2 nm. The dielectric constant of the silicon nitride films 44 and 45 is greater than that of the silicon oxide films 41 and 43 and smaller than that of the high-dielectric insulating film 42.

As described above, the inter-gate insulating film 4A' additionally includes the silicon nitride films (third insulating films) 44 and 45, and thus has the five-layer structure. Consequently, compared to the first embodiment, the second embodiment further reduces the possible leakage current from the inter-gate insulating film 4A and improves the coupling ratio of the memory cell.

Furthermore, in the memory cell MC according to the first embodiment, for example, during the oxidation process after processing of the gate electrode, an oxidant may diffuse through the silicon oxide film 41 and 43, and at an end of a gate electrode processing surface, form a wedge-shaped oxide film (bird's beak) at an interface between the floating gate electrode 3A and the inter-gate insulating film 4A or at an interface between the control gate electrode 5A and the inter-gate insulating film 4A. The bird's beak may reduce the coupling ratio of the memory cell.

However, according to the second embodiment, the silicon nitride film 44 is interposed between the silicon oxide film 41 and the floating gate electrode 3A. The silicon nitride film 45 is interposed between the control gate electrode 5A and the silicon oxide film 43. This prevents formation of a bird's beak at the interface between the floating gate electrode 3A or control gate electrode 5A and the inter-gate insulating film 4A' in the thermal oxidation after the processing of the gate electrode. Thus, a possible decrease in the coupling ratio of the memory cell caused by the bird's beak can be inhibited.

Therefore, the second embodiment of the present invention reduces the driving voltage of the memory cell and the possible leakage current in the memory cell and allows the inter-gate insulating film (multilayer insulator) to be thinned. The second embodiment improves the coupling ratio of the memory cell.

In FIG. 14, the silicon nitride films 44 and 45 are formed at the interface between the floating gate electrode 3A and the inter-gate insulating film 4A' and at the interface between the floating gate electrode 3A and the inter-gate insulating film 4A', respectively. However, the silicon nitride film may be formed exclusively at one of the interfaces; the silicon nitride film may be formed exclusively at the interface with the floating gate electrode 3A or at the interface with the control gate electrode 5A.

(b) Manufacturing Method

A method of manufacturing a flash memory according to the second embodiment of the present invention will be described with reference to FIG. 14. FIGS. 2 to 13 will be referenced for the same steps as those in the first embodiment, which will thus not be described below.

In steps similar to those shown in FIGS. 8 to 13 for the first embodiment, the gate insulating film 2 of the multilayer structure, the polysilicon film 3, and the mask layer 9 are sequentially formed on the semiconductor substrate 1 on which the well region Well has been formed. Thereafter, the trench Z is formed in the semiconductor substrate 1. The isolation insulating film 6 is formed in the trench Z. The mask layer 9 is removed, and then the insulator 4, serving as an inter-gate insulating film, and the polycide film 5, serving as a control gate electrode, are sequentially formed.

In the present embodiment, the insulator, serving as an inter-gate insulating film, is formed to have a five-layer structure as shown in FIG. 14. More specifically, for example, the silicon nitride film 44 is formed on the polysilicon film 3A to a thickness of at least approximately 1 nm and at most approximately 2 nm by the radical nitridization method. Then, the silicon oxide film 41 is formed on the silicon nitride film 44 to a thickness of approximately 2 to 3 nm using the CVD method. On the silicon oxide film 41, for example, the high-dielectric insulating film 42 made up of the $Al_2O_3$ film is formed to an approximate thickness of 3 to 5 nm by the ALD method. Moreover, the silicon oxide film 43 is formed on the high-dielectric insulating film 42 to an approximate thickness of 2 to 3 nm by the CVD method. The silicon nitride film 45 is formed on the silicon oxide film 43 to a thickness of at least approximately 1 nm and at most approximately 2 nm by the radical nitridization method or the CVD method. Thus, the insulator 4A', serving as an inter-gate insulating film of a five-layer structure, is formed. The polycide film 5A, serving as a control gate electrode, is formed on the insulator (inter-gate insulating film) 4A'. In FIG. 14, the silicon nitride films 44 and 45 are formed at the interface between the insulator 4A' and the gate electrode material 3A and at the interface between the inter-gate insulating film 4A' and the gate electrode material 5A, respectively. However, the silicon nitride film 44, 45 may be formed exclusively at the interface with the polysilicon film 3A or at the interface with the polysilicon film 5A.

In steps similar to those shown in FIGS. 2 and 3 for the first embodiment, the gate electrodes of the memory cells MC and the selection transistors ST1 and ST2 are formed by, for example, the RIE method. If an oxide film (not shown in the drawings) is formed on the side surfaces of the gate electrodes formed, since the silicon nitride films 44 and 45 are formed at the interface between the inter-gate insulating film 4A' and the gate electrode 3A and at the interface between the inter-gate insulating film 4A' and the gate electrode 5A, respectively, the possible formation of a bird's beak caused by the diffusion of the oxidant at the interface can be inhibited. Thus, the possible leakage current from the inter-gate insulating film 4A' can be reduced. Additionally, the possible decrease in the coupling ratio of the memory cell caused by the bird's beak can be inhibited. Thereafter, the interlayer insulating film, the bit line contact BC, and the bit line BL are sequentially formed. The above-described steps complete the flash memory according to the present embodiment.

As described above, in the memory cell according to the present embodiment, the tunneling insulating film 2A of the multilayer structure and the inter-gate insulating film (multilayer insulator) 4A' of the multilayer (five-layer) structure are formed.

Therefore, the method of manufacturing the nonvolatile semiconductor according to the second embodiment of the present invention allows provision of a memory cell which reduces the driving voltage and the possible leakage current and which thus allows the inter-gate insulating film (multilayer insulator) to be thinned to increase the coupling ratio of the memory cell.

(3) Third Embodiment

The description of the first and second embodiments relates to the memory cell including the floating gate electrode as a charge storage layer. However, the examples of the present invention are applicable to MONOS memory cells in which an insulating film containing a charge trap level is used as a charge storage layer. In a third embodiment of the present invention, examples using MONOS memory cells will be described with reference to FIGS. 15 to 29.

(3-1) First Example

(a) Structure

A structure of a flash memory according to a first example of the third embodiment of the present invention will be described with reference to FIGS. 15 to 17. FIG. 15 is a sectional view of the flash memory taken along line II-II (Y-direction) in FIG. 1. FIG. 16 is a sectional view of the flash memory taken along line III-III (X-direction) in FIG. 1. The same members as those described above are denoted by the same reference numerals and will not be described below in detail.

The memory cell in which the floating gate electrode is used as a charge storage layer is illustrated in the first and second embodiments. In contrast, the memory cell MC according to the present embodiment is of what is called a MONOS type in which an insulating film with a high charge trap density is used as a charge storage layer 3X as shown in FIGS. 15 and 16.

As shown in FIG. 16, the charge storage layer 3X is provided on the tunnel insulating film 2A on the surface of the element region. The charge storage layer 3X is, for example, a silicon nitride film of approximate film thickness 5 nm.

The multilayer insulator 4A is provided on the charge storage layer 3X. In the MONOS memory cell, the multilayer insulator 4A prevents electrons trapped in the charge storage layer 3X from leaking to the control gate electrode 5A on the multilayer insulator 4A. In the third embodiment, the multilayer insulators 4A and 4B are referred to as the block insulating films 4A and 4B.

The selection transistors ST1 and ST2 are formed in the same step as that in which the memory cells are formed as is the case with the first and second embodiments. Thus, the gate structure of the selection transistors ST1 and ST2 is such that an insulating film 3Y formed simultaneously with the charge storage layer 3X is interposed between the gate insulating film 2B and the block insulating film 4B.

As shown in FIG. 16, the charge storage layer 3X is not divided into pieces for the respective memory cells MC arranged adjacent to each other in the X-direction. This is because the charge storage layer 3X in the MONOS memory cell has a high trap density as described above and can thus hold changes for each memory cell without being divided in the X-direction. In this case, a bottom surface of the block insulating film 4A is in contact only with a top surface of the charge storage layer 3A. The tunnel insulating film 2A is provided on, for example, on the semiconductor substrate 1 and the isolation insulating film 6.

FIG. 17 is an enlarged view of a region XVII enclosed by a dashed line in FIG. 16. The structure of the tunnel insulating film 2A and the block insulating film 4A will be more specifically described with reference to FIG. 17.

The tunnel insulating film 2A has the multilayer structure made up of, for example, the silicon oxide film 21, the high-dielectric insulating film 22, and the silicon oxide film 23. Here, the film thickness of the silicon oxide films 21 and 23 is such that electrons perform direct tunneling through the silicon oxide film, for example, at least approximately 1 nm and at most approximately 2.5 nm. Furthermore, for example, an $Al_2O_3$ is used as the high-dielectric insulating film 22 and has a film thickness of at least approximately 2 nm and at most approximately 3 nm.

In the third embodiment, as is the case with the first embodiment, when a high electric field is applied to the tunnel insulating film 2A during the write operation, electrons perform direct tunneling through the silicon oxide film 21. This increases the tunnel current flowing through the tunnel insulating film 2A. As a result, the write voltage of the memory cell can be reduced. During the erase operation, the electrons perform direct tunneling through the silicon oxide film 23, increasing the tunnel current. Thus, the erase voltage of the memory cell can be reduced. Furthermore, when a low electric field is applied to the tunnel insulating film 2A, for example, during the read operation, the silicon oxide film 21, the high-dielectric insulating film 22, and the silicon oxide film 23 serve as a potential barrier to reduce the leakage current flowing through the tunnel insulating film 2A. As a result, the charge retention characteristics of the memory cell can be improved.

The block insulating film 4A has the multilayer structure made up of the silicon oxide film 41, the high-dielectric insulating film 42, and the silicon oxide film 43. The film thickness of the two silicon oxide films 41 and 43 is, for example, at least approximately 3 nm and at most approximately 5 nm. An $Al_2O_3$ film of film thickness at least approximately 4 nm and at most approximately 5 nm is used as the high-dielectric insulating film 42. Thus, as is the case with the first embodiment, compared to the ONO film, the $Al_2O_3$ film reduces in the leakage current flowing through the block insulating film 4A. Consequently, the charge retention characteristics of the memory cell can be improved. Furthermore, since in the MONOS memory cell, the charge storage layer is an insulating film, an increase in the film thickness of the charge storage layers 3X and 3Y is not preferable for stabilizing the operation of the memory cells MC and the selection transistors ST1 and ST2. This prevents provision of the appropriate film thickness of the charge storage layer 3X. Then, the block insulating film 4A and the control gate electrode 5A are not formed on the side surface of the charge storage layer 3X in the X-direction. This in turn prevents the opposed area between the charge storage layer 3X and the control gate electrode 5A from being increased to improve the coupling ratio. Thus, in the structure in which only the top surface of the charge storage layer 3X is in contact with the block insulating film 4A, the high-dielectric insulating film 42 is effectively used to improved the coupling ratio as in the case of the present embodiment.

Additionally, when the tunnel insulating film 2A is configured as described above to reduce the write voltage to be reduced, the block insulating film 4A can be thinned. This increases the electric field applied to the tunnel insulating film 2A via the charge storage layer 3X, further reducing the write voltage.

Moreover, the MONOS memory cell performs charge retention contributing to the trap level in the insulating layer 3X; the MONOS memory cell offers improved charge retention characteristics compared to the memory cell in which the floating gate electrode is used as a charge storage layer.

Consequently, the first example of the third embodiment of the present invention reduces in the driving voltage of the memory cell and in the possible leakage current from the memory cell using the tunnel insulating film (gate insulating film) 2A of the multilayer structure and the block insulating film (multilayer insulator) 4A of the multilayer structure. This in turn allows the block insulating film (multilayer insulator) to be thinned, improving the coupling ratio of the memory cell. The improved coupling ratio of the memory cell further reduces the driving voltage.

The block insulating film 4A illustrated in the present embodiment is not limited to the three-layer structure and may have a five-layer structure as is the case with the second embodiment. Furthermore, the high-dielectric insulating films 22 and 42 illustrated in the present embodiment are not limited to the $Al_2O_3$ film and may be made of another high-dielectric material (for example, $HfO_2$).

(b) Manufacturing Method

Figure 18:
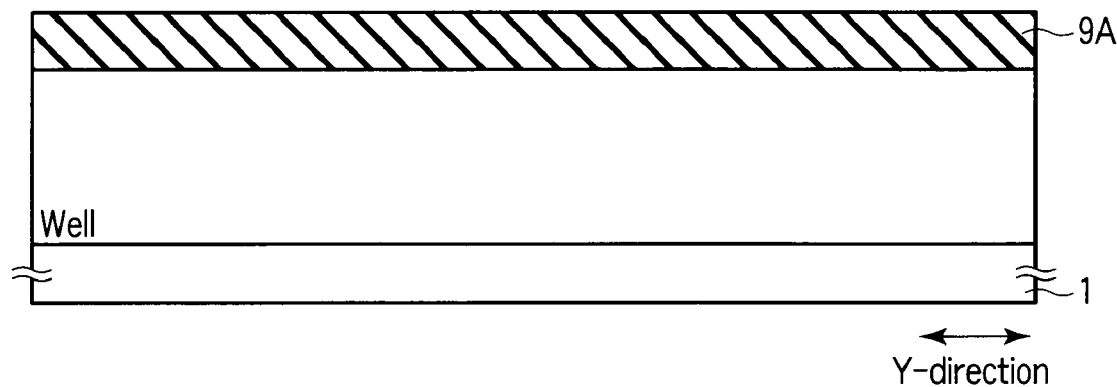
FIG. 18 is a diagram showing a step of a method of manufacturing a nonvolatile semiconductor memory according to the third embodiment.
Figure 19:
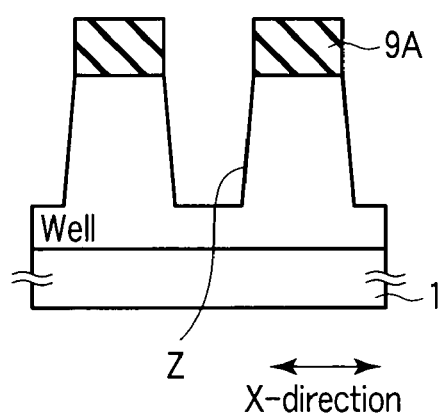
FIG. 19 is a diagram showing a step of the method of manufacturing the nonvolatile semiconductor memory according to the third embodiment.
Figure 20:
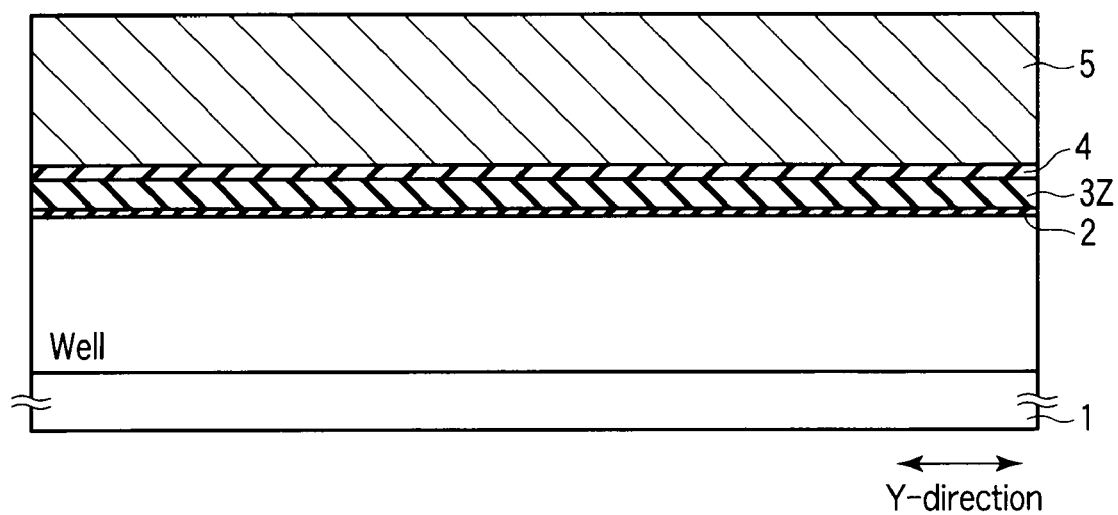
FIG. 20 is a diagram showing a step of the method of manufacturing the nonvolatile semiconductor memory according to the third embodiment.
Figure 21:
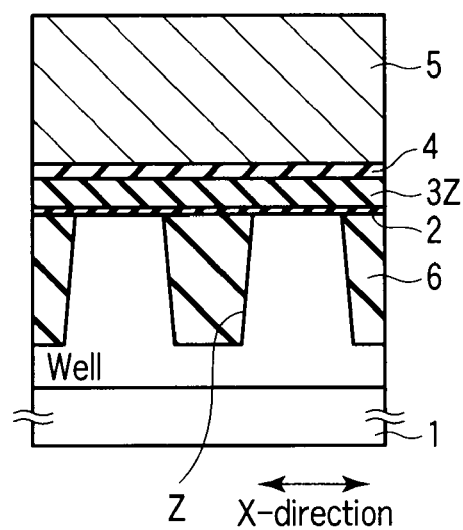
FIG. 21 is a diagram showing a step of the method of manufacturing the nonvolatile semiconductor memory according to the third embodiment.

Now, a method of manufacturing a nonvolatile semiconductor memory according to the first example of the third embodiment of the present invention will be described with reference to FIGS. 15 to 21. FIGS. 18 and 20 show a manufacturing step for a cross section of the semiconductor memory taken along the Y-direction. FIGS. 19 and 21 show a manufacturing step for a cross section of the semiconductor memory taken along the X-direction.

As shown in FIGS. 18 and 19, the well region Well is formed in the semiconductor substrate 1 by ion implantation. A mask layer (for example, a silicon nitride film) 9A is then formed on the semiconductor substrate 1. The mask layer 9A serves as a mask used to form, by etching, a trench serving as an isolation region. The mask layer 9A is then patterned by the photolithography technique. Based on the pattern, the mask layer 9A and the semiconductor substrate 1 are sequentially etched by, for example, the RIE method. Thus, the trench Z, used to form the isolation region, is formed in the semiconductor substrate 1.

A silicon oxide film is formed in the trench portion Z and then subjected to the flattening process by the CMP method using the mask layer 9A as a stopper. The silicon oxide film is then etched by the RIE method so that as shown in FIGS. 20 and 21, an upper end of the isolation insulating film 6 is almost positionally aligned with an upper end of the semiconductor substrate 1. The mask layer is thereafter removed.

The gate insulating film 2, which serves as a tunnel insulating film of a memory cell, is formed on the semiconductor substrate 1 and the isolation insulating film 6. In the third embodiment of the present invention, the gate insulating film 2 has a multilayer structure. For example, as shown in FIG. 17, the silicon oxide film 21 is formed on the semiconductor substrate 1, and the $Al_2O_3$ film 22 and the silicon oxide film 23 are sequentially formed on the semiconductor substrate 1 and the isolation insulating film 6. The silicon oxide film 21 is formed using, for example, thermal oxidation so that the film thickness of the silicon oxide film 21 is such that carriers (electrons) perform direct tunneling through the silicon oxide film, for example, at least approximately 1 nm and at most approximately 2.5 nm. The $Al_2O_3$ film 23 is formed to a film thickness of at least approximately 2 nm and at most approximately 3 nm by, for example, the ALD method. The silicon oxide film 23 is formed using, for example, the CVD method so that the film thickness of the silicon oxide film 23 is such that electrons perform direct tunneling through the silicon oxide film, for example, at least approximately 1 nm and at most approximately 2.5 nm. Alternatively, the silicon oxide film 21 may be formed on the semiconductor substrate 1 and the isolation insulating film 6 using, for example, the CVD method.

An insulating film 3Z having a high charge trap density and serving as a charge storage layer is formed on the gate insulating film 2 by the CVD method. The insulating film 3Z is a silicon nitride film of approximate film thickness 5 nm. The insulator 4, serving as a block insulating film, is formed on the insulating film 3Z. For example, as shown in FIG. 17, the insulator 4 has a three-layer structure; the silicon oxide film 41, the $Al_2O_3$ (high-dielectric insulating film) 42, and the silicon oxide film 43 are sequentially formed in the insulator 4. The silicon oxide film 41 is formed to a film thickness of at least 3 nm and at most 5 nm, by, for example, the CVD method. The $Al_2O_3$ film 42 is formed to a film thickness of at least approximately 4 nm and at most approximately 5 nm by, for example, the ALD method. The silicon oxide film 43 is formed to a film thickness of at least approximately 3 nm and at most approximately 5 nm using, for example, the CVD method. Then, the polycide film 5, serving as a control gate electrode, is formed on the insulator 4 by the CVD method.

As is the case with the first embodiment, the polycide film 5, the multilayer insulator 4, and the insulating layer 3 are sequentially etched by the RIE method. As shown in FIGS. 15 and 16, the gate electrodes of the memory cells MC and the selection transistors ST1 and ST2 are formed on the gate insulating films 2A and 2B, respectively. The diffusion layer 7, serving as a source/drain region, is then formed by, for example, ion implantation through the formed gate electrode as a mask. Thereafter, the interlayer insulating film 8 is formed on the semiconductor substrate 1, and the bit line contact BC and the bit line BL are sequentially formed. The above-described steps complete the flash memory according to the present embodiment.

The present embodiment uses the insulating film (silicon nitride film) with the high trap density as a charge storage layer. This eliminates the need for a step of separating the charge storage layer in the X-direction as is the case with the use of a floating gate electrode (polysilicon film) as the charge storage layer. Thus, the method of manufacturing the flash memory using the MONOS structure includes the simplified steps compared to the method of manufacturing the flash memory using the floating gate electrode. Furthermore, the multilayer insulator 4, serving as a block insulating film, is not limited to the three-layer structure and may have a five-layer structure as is the case with the second embodiment of the present invention.

As described above, in the MONOS memory cell according to the present embodiment, the tunnel insulating film 2A of the multilayer structure and the block insulating film (multilayer insulator) of the multilayer structure are formed.

Therefore, with the method of manufacturing the nonvolatile semiconductor memory according to the first example of the third embodiment of the present invention, a memory cell can be provided which reduces the driving voltage and the possible leakage current and which thus allows the block insulating film (multilayer insulator) to be thinned, improving the coupling ratio of the memory cell.

(3-2) Second Example (a) Structure

A structure of a flash memory according to a second example of the present embodiment will be described with reference to FIGS. 22 and 23. FIG. 22 shows a sectional view of the memory cell MC in the second example of the present embodiment taken along the X-direction (channel width direction). FIG. 23 shows an enlarged view of a region XXIII enclosed by a dashed line in FIG. 22. In the present example, the sectional structure of the memory cell MC along the Y-direction (channel length direction) is the same as that in FIG. 15 for the first example and will thus not described below.

In the first example, as shown in FIG. 16, the structure of the memory MC in the X-direction (channel width direction) is such that the upper end of the isolation insulating film 6 is almost positionally aligned with the upper end of the semiconductor substrate 1 and such that the charge storage layer 3X is not divided into pieces for the memory cells arranged adjacent to one another in the X-direction and the charge storage later 3Z extends along the X-direction.

However, the present invention is not limited to this aspect. For example, as shown in FIG. 22, the upper end of the isolation insulating film 6 may be almost positionally aligned with the upper end of the charge storage layer 3X, which may be divided into pieces for the respective memory cells. In this case, a bottom surface of the block insulating film 4A is in contact with a top surface of the charge storage layer 3X and a top surface of the isolation insulating film 6. The entire side surfaces of the charge storage layer 3X are in contact with the isolation insulating film 6.

As shown in FIG. 23, as is the case with the first example, the tunnel insulating film (gate insulating film) 2A and block insulating film (multilayer insulator) 4A in the present example have respective multilayer structures.

Thus, the present example exerts effects similar to those of the first example; the present example reduces the driving voltage and the possible leakage current, allows the block insulating film (multilayer insulator) to be thinned, and improves the coupling ratio of the memory cell.

In the structure shown in FIGS. 22 and 23, a polysilicon film may be used as the insulating layer (silicon nitride film) serving as the charge storage layer 3X. Furthermore, as is the case with the first and second embodiments, the structure is also applicable to memory cells using floating gate electrodes. In the structure, side surfaces of the floating gate electrode in the X-direction are not covered with the multilayer insulator 4A or the control gate electrode 5A. This eliminates the need to ensure a long distance between the adjacent memory cells in order to allow the multilayer insulator 4A and the control gate electrode 5A to be formed on the side surfaces of the floating gate electrode 3A. The size of the isolation region can thus be reduced. Consequently, the element region (memory cell) and the isolation region can be miniaturized to increase the storage capacity of the flash memory.

(b) Manufacturing Method

Now, a method of manufacturing a flash memory according to the second example of the third embodiment of the present invention will be described with reference to FIGS. 15 and 22 to 25.

Figure 24:
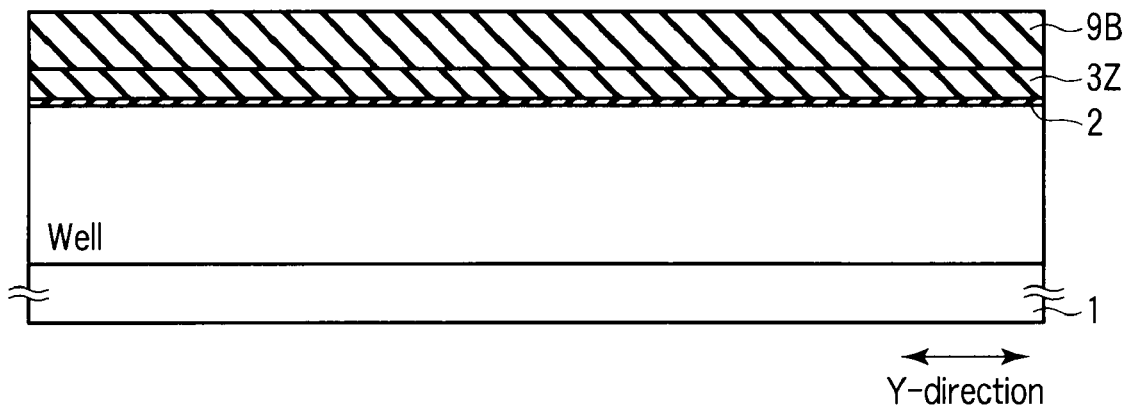
FIG. 24 is a diagram showing a step of the method of manufacturing the nonvolatile semiconductor memory according to the third embodiment.
Figure 25:
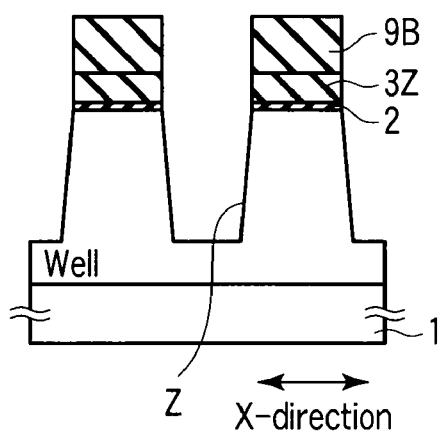
FIG. 25 is a diagram showing a step of the method of manufacturing the nonvolatile semiconductor memory according to the third embodiment.

As shown in FIGS. 24 and 25, the following are sequentially formed on the surface of the semiconductor substrate 1 on which the well region Well has been formed: the gate insulating film 2 of the multilayer structure, serving as a tunnel insulating film of a memory cell, the insulating layer 3Z, serving as a charge storage layer of a memory cell, and a mask layer 9B. Then, the mask layer 9B is patterned by the photolithography technique. Based on the pattern formed, the mask layer 9B, the insulating layer 3Z, the insulating film 2, and the semiconductor substrate 1 are sequentially etched to form the trench Z in the semiconductor substrate 1.

As shown in FIG. 22, the isolation insulating film 6, made up of a silicon oxide film, is formed in the trench Z by, for example, the CMP and RIE methods so that an upper end of the insulating layer 3Z almost aligns with the upper end of the isolation insulating film 6.

The mask layer on the charge storage layer is removed. Then, as shown in FIGS. 15 and 22, the multilayer insulator 4A, serving as a block insulating film of a multilayer structure, is formed on the insulating layer 3X and the isolation insulating film 6. Moreover, the polycide film 5A, serving as a control gate electrode, is formed on the block insulating film 4A. Steps similar to those in the first example are then carried out to form the gate electrodes of the memory cells and the selection transistors and to form the diffusion layers, serving as a source/drain region, in the semiconductor substrate 1. The interlayer insulating film 8, the bit line contact BC, and the bit line BL are then sequentially formed. The above-described steps complete the flash memory in the present example.

As described above, also in the present example, the MONOS structure memory cell is formed which includes the tunnel insulating film 2A of the multilayer structure and the block insulating film (multilayer insulator) 4A of the multilayer structure.

Therefore, also with the method of manufacturing the nonvolatile semiconductor memory according to the second example of the present embodiment, a memory cell can be provided which reduces in the driving voltage, possible leakage current and in the thickness of the block insulating film (multilayer insulator), and which improves the coupling ratio of the memory cell.

(3-3) Third Example (a) Structure

Figure 26:
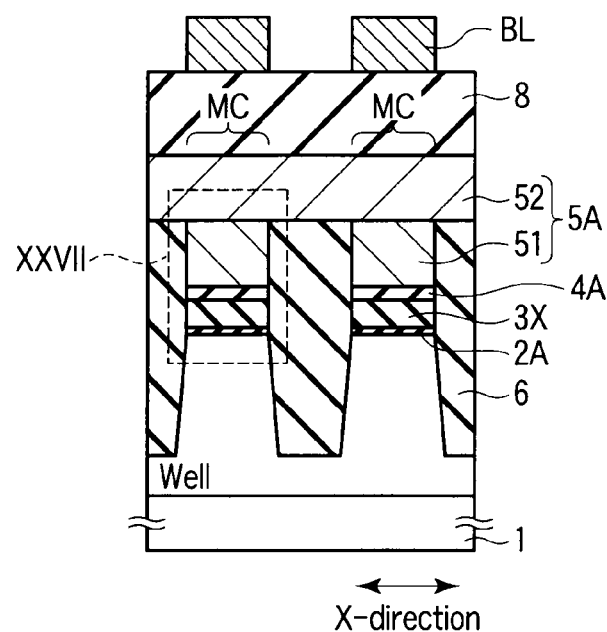
FIG. 26 is a sectional view of the nonvolatile semiconductor memory according to the third embodiment taken along line III-III in FIG. 1.
Figure 27:
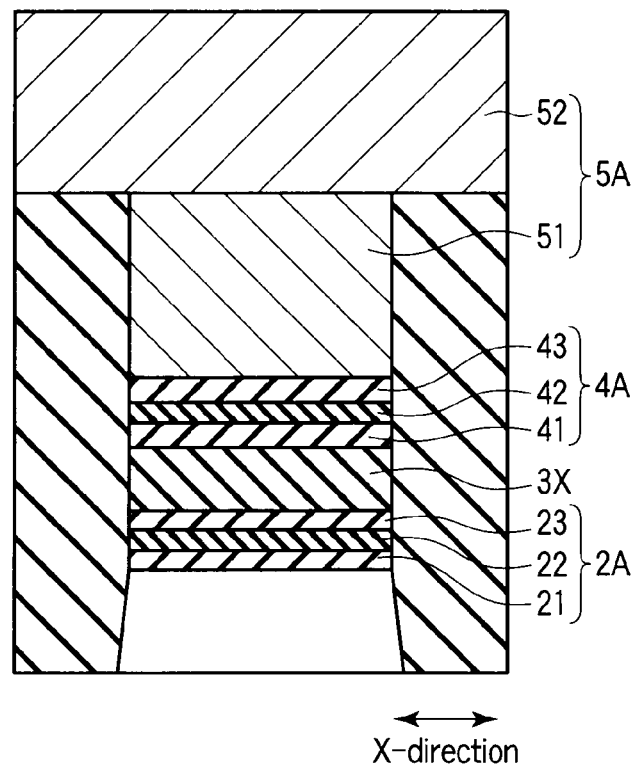
FIG. 27 is an enlarged view showing the structure of the gate insulating film and the multilayer insulator according to the third embodiment.

A structure of a flash memory according to a third example of the present embodiment will be described with reference to FIGS. 26 and 27. FIG. 26 shows a sectional view of the memory cell MC in the third example of the present embodiment taken along the X-direction (channel width direction). FIG. 27 shows an enlarged view of a region XXVII enclosed by a dashed line in FIG. 26. Also in the present example, the sectional structure of the memory cell MC along the Y-direction (channel length direction) is the same as that in FIG. 15 for the first example and will thus not described below.

In the memory cell shown in FIG. 26, the control gate electrode 5A is composed of a lower control gate electrode 51 that is in contact with the block insulating film 4A and an upper control gate electrode 52 provided on the lower control gate electrode 51 and the isolation insulating film 6. In this structure, the isolation insulating film 6 is in direct contact with the lower and upper control gate electrodes 51 and 52. Specifically, side surfaces of the lower control gate electrode 51 in the X-direction are in contact with side surfaces of the isolation insulating film 6. A bottom surface of the upper control gate electrode 52 is in contact with a top surface of the isolation insulating film 6.

The lower control gate electrode 51 is composed of, for example, a polysilicon film. The upper control gate electrode 52 is composed of, for example, a silicide film or a metal film such as tungsten or aluminum. The lower and upper control gate electrode 51 and 52 may be composed of the same material, for example, a polysilicon film or a silicide film.

As shown in FIG. 27, as is the case with the first and second example, the tunnel insulating film (gate insulating film) 2A and block insulating film (multilayer insulator) 4A in the present example have the respective multilayer structures.

Thus, the present example exerts effects similar to those of the first and second examples; the present example reduces the driving voltage of the memory cell and the possible leakage current in the memory cell, allows the block insulating film (multilayer insulator) to be thinned, and improves the coupling ratio of the memory cell.

The structure shown in FIGS. 26 and 27 may be applied to memory cells using floating gate electrodes as is the case with the first and second embodiments by using a polysilicon film instead of the insulating layer (silicon nitride film) serving as the charge storage layer 3X.

(b) Manufacturing Method

Now, a method of manufacturing a flash memory according to the third example of the present embodiment will be described with reference to FIGS. 15 and 26 to 29.

As shown in FIGS. 28 and 29, the following are sequentially formed, by, for example, the CVD method, on the surface of the semiconductor substrate 1 on which the well region Well has been formed: the gate insulating film 2 of the multilayer structure, serving as a tunnel insulating film of a memory cell, the insulating layer 3Z, serving as a charge storage layer of a memory cell, the multilayer insulator 4, serving as a block insulating film of a memory cell, the conductive layer (for example, a polysilicon film) 51, serving as a lower control gate electrode of a memory cell, and a mask layer 9C (for example, a silicon nitride film). Then, the mask layer 9C is patterned by the photolithography technique. Based on the pattern formed, etching is carried out on the mask layer 9C, the conductive layer 51, the multilayer insulator 4, the insulating layer 3Z, the gate insulating film 2, and the semiconductor substrate 1 to form the trench Z in the semiconductor substrate 1.

As is the case with the first and second examples, an isolation insulating film (for example, a silicon oxide film) is formed in the trench Z using the CVD and CMP methods. The mask layer 9C is then removed. Then, the isolation insulating film 6 is etched so that for example, as shown in FIGS. 15 and 26, the upper end of the isolation insulating film 6 is almost positionally aligned with an upper end of the conductive layer 51. A conductive layer (for example, a silicide layer or a metal film) 52 serving as an upper control gate electrode is formed on the conductive layer 51 and the isolation insulating film 6. The gate electrodes of the memory cells MC and the selection transistors ST1 and ST2 are then formed, and the diffusion layers 7, 7D, and 7S, serving as a source/drain region, are formed. Moreover, the interlayer insulating film 8, the bit line contact BC, and the bit line BL are sequentially formed to complete the flash memory in the present example.

The isolation insulating film 6 may be etched such that the upper end of the isolation insulating film 6 is positioned lower than that of an upper end of the lower control gate electrode 51. In this case, formation of the upper control gate electrode 52 allows exposed side surfaces of the lower control gate electrode 51 to be covered with the upper control gate electrode 52. This ensures a large contact area between the lower control gate electrode 51 and the upper control gate electrode 52 to inhibit possible parasitic resistance between the lower and upper control gate electrodes 51 and 52. However, the etching of the isolation insulating film 6 may be avoided so that the upper end of the isolation insulating film 6 remains higher than the upper end of the lower control gate electrode 51.

As described above, also in the MONOS structure memory cell in the present example, the tunnel insulating film 2A of the multilayer structure and the block insulating film (multilayer insulator) 4A of the multilayer structure are formed.

Therefore, also with the method of manufacturing the nonvolatile semiconductor memory according to the third example of the present embodiment, a memory cell can be provided which reduces the driving voltage, possible leakage current and thickness of the block insulating film (multilayer insulator), and which improves the coupling ratio of the memory cell.

(4) Applied Example

Figure 30:
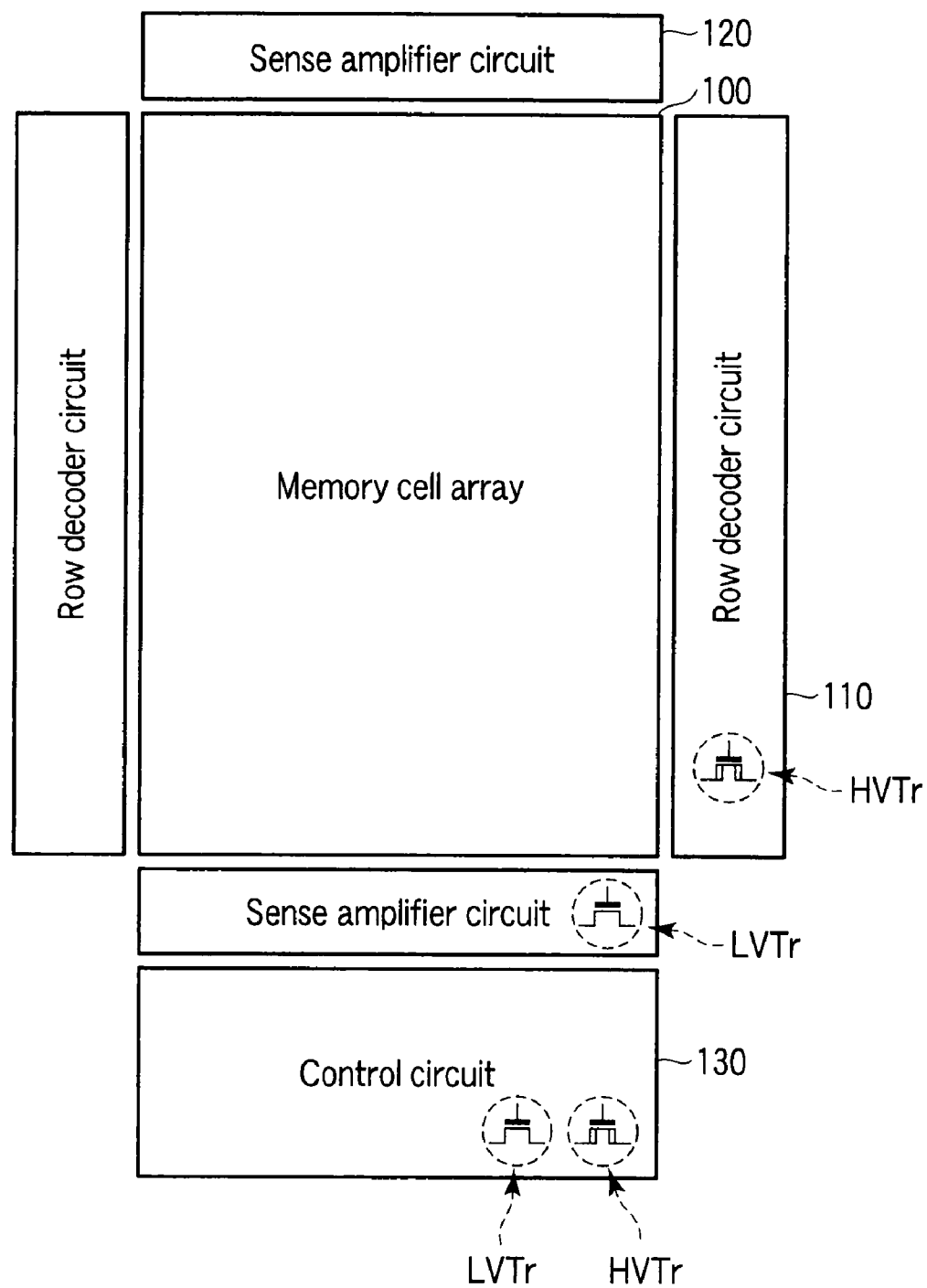
FIG. 30 is a diagram showing an applied example of the embodiments.

In the description of the first to third embodiments, the memory cells and the selection transistors are provided in the memory cell array. If the memory cell array including the memory cells and the selection transistors as described in the first to third embodiments is applied to one memory chip, then for example, as shown in FIG. 30, a row decoder circuit 110, a sense amplifier circuit 120, and a control circuit 130 are provided around the periphery of a memory cell array 100.

The row decoder circuit 110 includes a plurality of high-breakdown-voltage transistors HVTr to control operation of the word lines and to transfer high potentials to the word lines. The sense amplifier circuit 120 temporarily holds data and contains a plurality of low-breakdown-voltage transistors LVTr. The control circuit 130 controls operation of the whole memory chip and contains low-breakdown-voltage transistors LVTr and high-breakdown-voltage transistors HVTr.

Circuits like the row decoder circuit 110, the sense amplifier circuit 120, and the control circuit 130 are called peripheral circuits; the circuits are formed on the same chip as that on which the memory cell array is formed. The low- and high-breakdown-voltage transistors LVTr and HVTr, provided in the peripheral circuits, are called peripheral transistors.

The peripheral transistors are formed on the same chip as that on which the memory cell array is formed so that some of the steps of forming the memory cells are also used to form the peripheral transistors in order to reduce the steps of manufacturing the memory chip.

(4-1) First Applied Example

The applied examples of the embodiments of the present invention will be described with reference to FIGS. 31 to 35 in connection with the structure of the memory cell as well as the structure and manufacturing method of the peripheral transistors HVTr and LVTr.

Members in the applied examples which are common to the first to third embodiments are denoted by the same reference numerals. Details of these members will be described as required.

(a) Structure

The structure of a nonvolatile semiconductor memory in a first applied example will be described with reference to FIG. 31.

Figure 31:
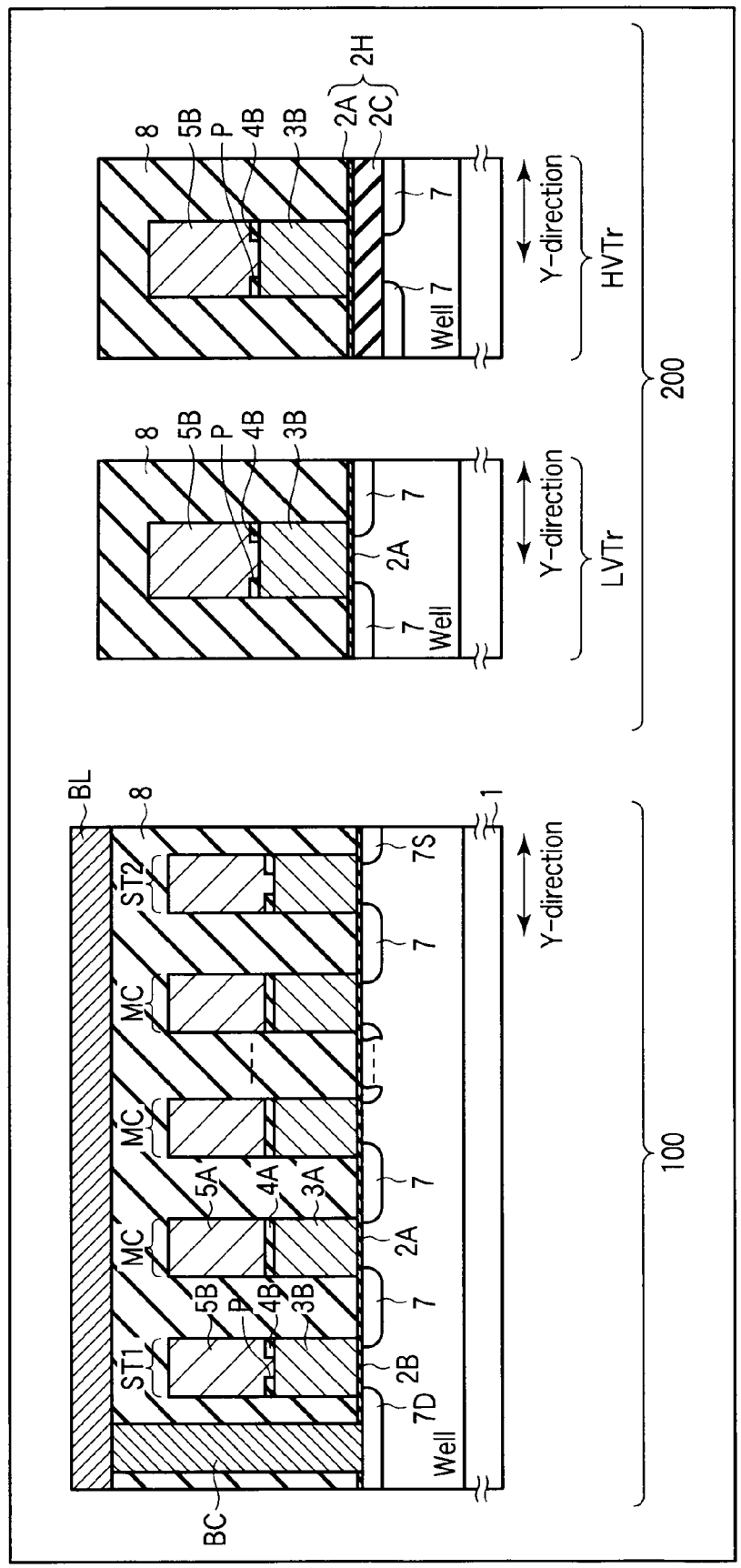
FIG. 31 is a diagram illustrating a structure in a first applied example.

FIG. 31 shows the internal structure of the memory cell array 100 and the structure of the high-breakdown-voltage transistor LVTr and high-breakdown-voltage transistor HVTr provided in a peripheral circuit region 200. FIG. 31 shows a cross section of the low- and high-breakdown-voltage transistors LVTr and HVTr taken along the Y-direction. Here, the Y-direction corresponds to the channel length direction of an MIS transistor. In FIG. 31, contact plugs and interconnection layers connected to the low- and high-breakdown-voltage transistors LVTr and HVTr are not illustrated.

In the present example, the gate insulating film 2A of each of the selection transistors ST1 and ST2 has the same structure as that of the tunnel insulating film 2A of the memory cell MC shown in FIG. 4. The gate insulating film 2A has, for example, a three-layer structure composed of the silicon oxide film 21, the high-dielectric insulating film 22, and the silicon oxide film 23.

The low-breakdown-voltage transistors LVTr and the high-breakdown-voltage transistor HVTr are provided in the peripheral circuit region 200. The low- and high-breakdown-voltage transistors LVTr and HVTr are Metal-Insulator-Semiconductor (MIS) transistors.

A gate structure of the low- and high-breakdown-voltage transistors LVTr and HVTr is such that the upper gate electrode 5B is laminated on the lower gate electrode 3B via the inter-gate insulating film 4B. The upper gate electrode 5B is electrically connected to the lower gate electrode 3B via the opening P, formed in the inter-gate insulating film 4B. In the present example, the lower gate electrode 3B is formed simultaneously with the formation of the floating gate electrode 3A. The upper gate electrode 5B is formed simultaneously with formation of the control gate electrode 5A.

The gate electrodes 3B and 5B of the low-breakdown-voltage transistor LVTr are provided on the gate insulating film 2A, formed on the semiconductor substrate 1. Like the gate insulating film 2A of each of the selection transistors ST1 and ST2, the gate insulating film 2A of the low-breakdown-voltage transistor LVTr has the same structure as that of the tunnel insulating film 2A.

On the other hand, a gate insulating film 2H of the high-breakdown-voltage transistor HVTr is composed of a lower gate insulating film 2C formed on the semiconductor substrate 1 and the upper gate insulating film 2A, laminated on the insulating film 2C. The lower gate insulating film 2C is made up of, for example, a silicon oxide film and is 35 to 50 nm in film thickness. The structure of the upper gate insulating film 2A is similar to that of the tunnel insulating film 2A.

Here, the selection transistors ST1 and ST2 and the low-breakdown-voltage transistor LVTr are driven by applying an approximate voltage 1.5 to 3.5V to the gate electrodes 3B and 5B of the transistors. That is, unlike in the case of the gate electrode of the memory cell MC, no high potential is supplied to the gate electrodes 3B and 5B. Thus, even though the gate insulating films of the selection transistors ST1 and ST2 and the low-breakdown-voltage transistor LVTr have the same structure as that of the tunnel insulating film of the memory cell, tunneling of electrons from the semiconductor substrate 1 to the gate electrodes 3A and 5A is avoided in the selection transistors ST1 and ST2 and the low-breakdown-voltage transistor LVTr.

On the other hand, a high potential of for example, approximately 15 to 25V is applied to gate electrodes 3B and 5B of the high-breakdown-voltage transistor. However, the lower gate insulating film 2C formed on the semiconductor substrate 1 avoids the tunneling of electrons in the gate electrode 3B, 5B.

Thus, the use of the structure of the memory cell according to the embodiments of the present invention allows the memory cell and the peripheral transistors to be formed on the same chip.

Therefore, the case in which the present invention is applied to the memory chip including the peripheral transistors exerts effects similar to those of the case in which the present invention is applied to the memory cell according to the embodiments.

(b) Manufacturing Method

A method of manufacturing a nonvolatile semiconductor memory according to the first applied example will be described with reference to FIGS. 32 to 35. Here, in the peripheral circuit region 200, a region in which the low-breakdown-voltage transistor is formed is referred to as a low-breakdown-voltage transistor formation region LVTr. A region in which the high-breakdown-voltage transistor is formed is referred to as a high-breakdown-voltage transistor formation region HVTr.

A well region Well is formed in the semiconductor substrate 1 by ion implantation.

Figure 32:
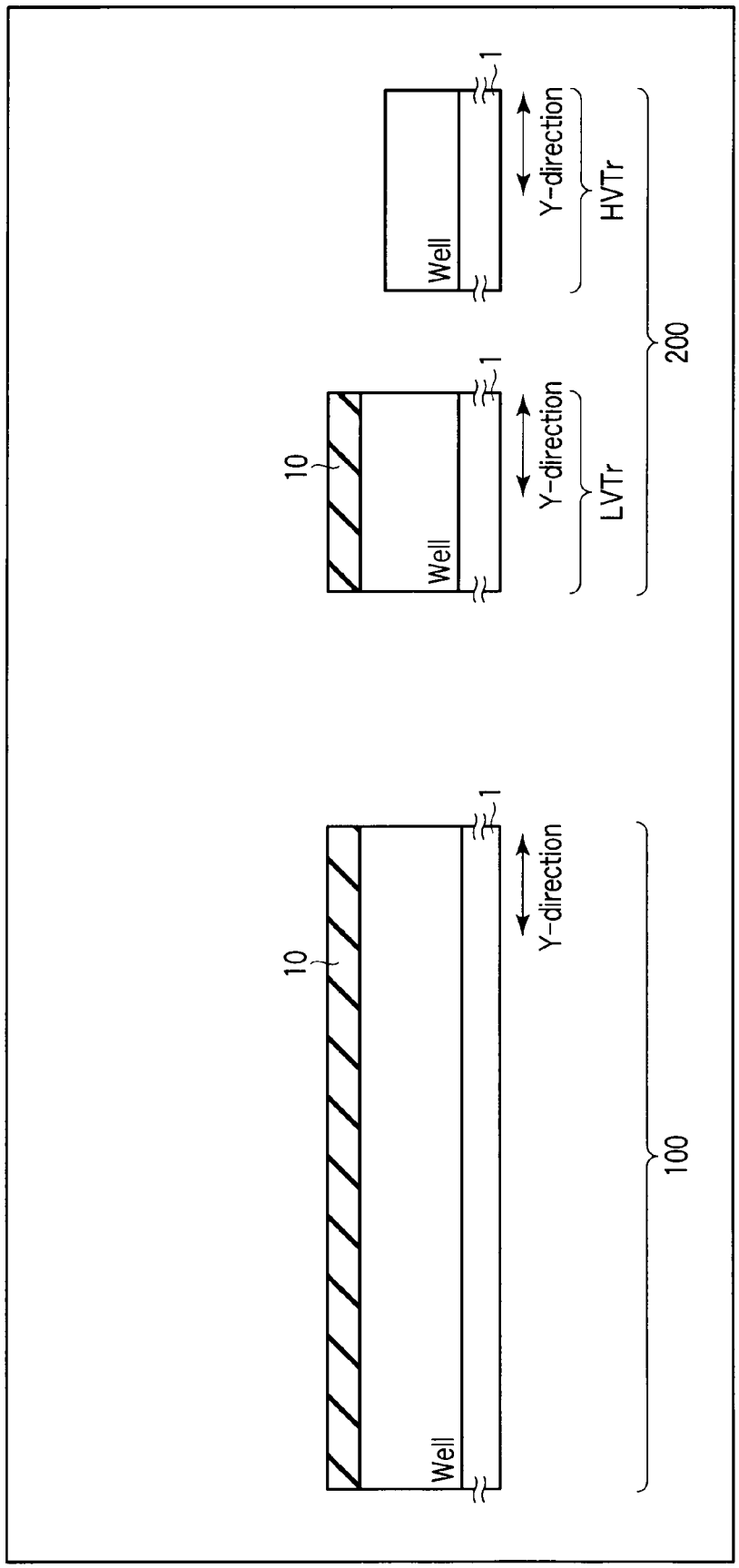
FIG. 32 is a diagram illustrating a manufacturing method in the first applied example.

Then, as shown in FIG. 32, a mask layer 10 is formed in the memory cell array 100 and low-breakdown-voltage transistor formation region LVTr on the semiconductor substrate 1. The semiconductor substrate 1 is then etched in the high-breakdown-voltage transistor formation region HVTr using an etching technique, for example, the RIE method or wet etching. At this time, the depth by which the semiconductor substrate is etched is adjusted such that a top surface of the gate insulating film of each of the memory cell and the low-breakdown-voltage transistor, formed in the subsequent step, is located at almost the same height of a top surface of the gate insulating film of the high-breakdown-voltage transistor.

Figure 33:
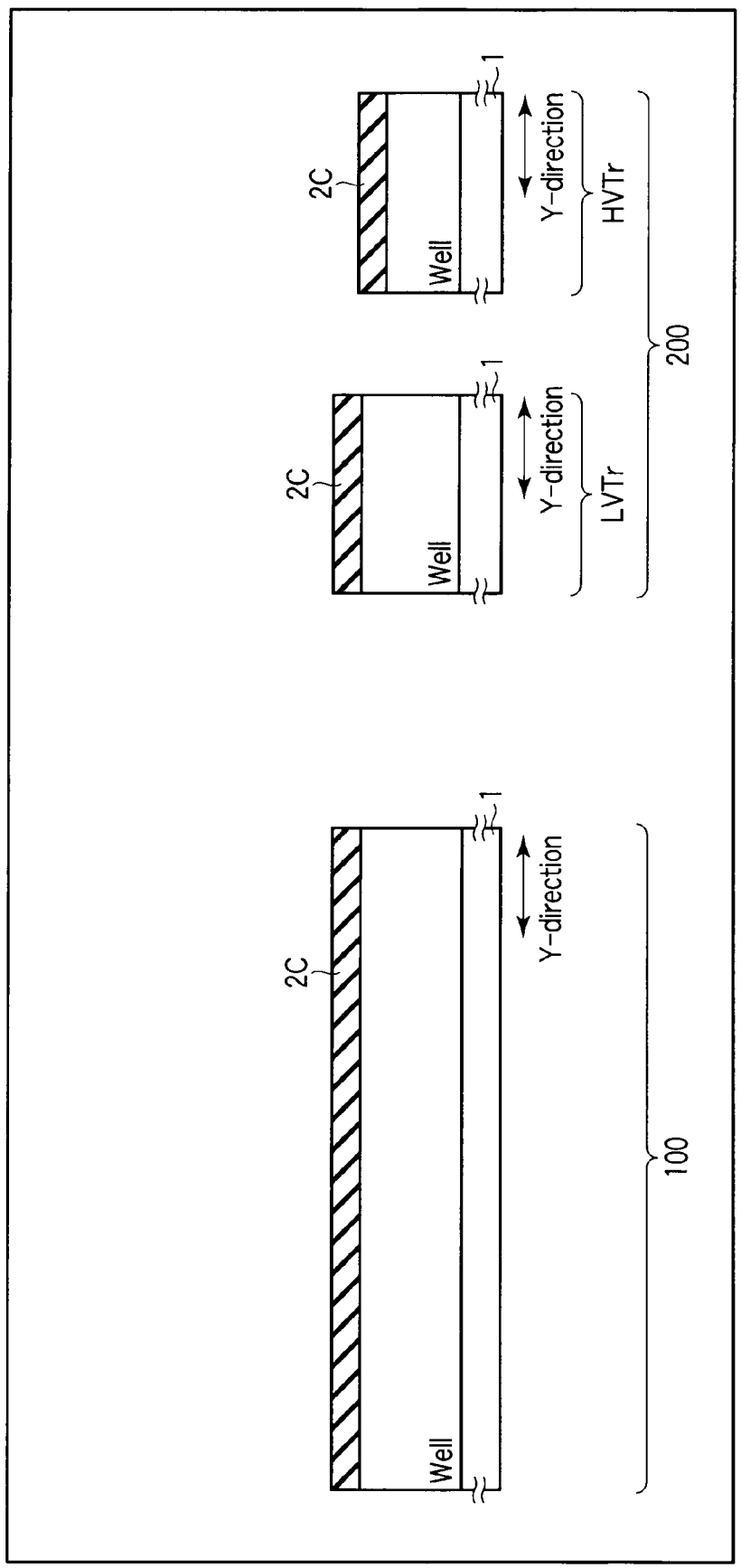
FIG. 33 is a diagram illustrating the manufacturing method in the first applied example.

As shown in FIG. 33, the mask layer 10 on the semiconductor substrate 1 is removed from the memory cell array 100 and the low-breakdown-voltage transistor formation region LVTr. The lower gate insulating film 2C, making up a part of the gate insulating film of the high-breakdown-voltage transistor, is formed on the semiconductor substrate 1 by, for example, the thermal oxidation method.

Figure 34:
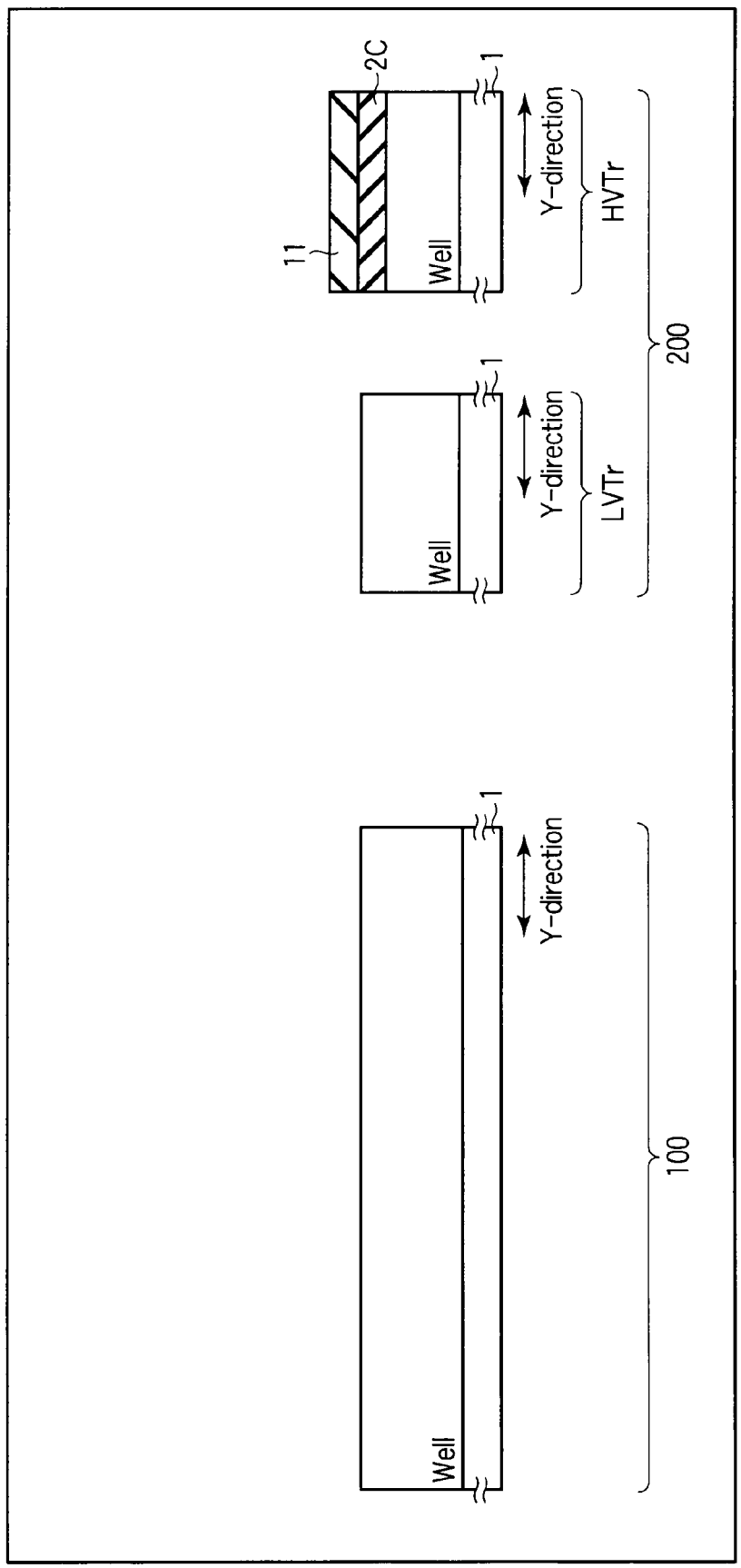
FIG. 34 is a diagram illustrating the manufacturing method in the first applied example.

As shown in FIG. 34, a mask layer 11 is formed on the semiconductor substrate 1 in the high-breakdown-voltage transistor formation region HVTr. The insulating film on the semiconductor substrate 1 is then etched in the memory cell array 100 and the low-breakdown-voltage transistor formation region LVTr using the etching technique, for example, the RIE method or wet etching.

Figure 35:
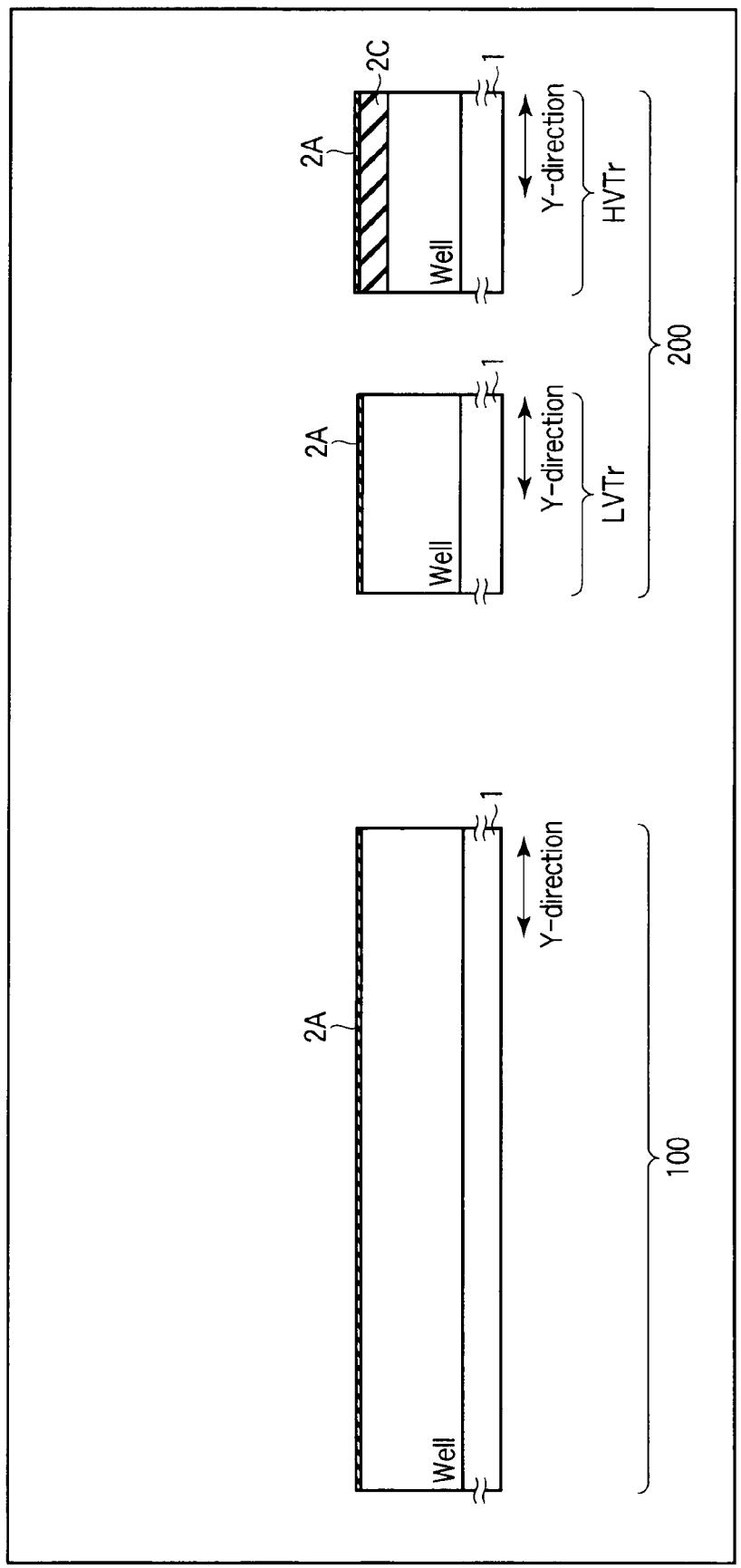
FIG. 35 is a diagram illustrating the manufacturing method in the first applied example.

Then, the mask layer 11 is removed, and then as shown in FIG. 35, the insulating film 2A in the three-layer structure is formed, for example, as in the case of the step shown in FIG. 4. The insulating film 2A is sequentially formed so as to have, for example, a laminate structure of a silicon oxide film, a high-dielectric insulating film, and a silicon oxide film. More specifically, the insulating film 2A is formed as follows. The lower silicon oxide 21 film is formed on a surface of the insulating film 2C on the semiconductor substrate 1 to a film thickness of at least approximately 1 nm and at most approximately 2.5 nm using, for example, thermal oxidation. For example, $Al_2O_3$ film is formed on the silicon oxide film 21 to a film thickness of at least approximately 2 nm and at most approximately 3 nm using the ALD method. The upper silicon oxide film is formed on the $Al_2O_3$ film 22 to a film thickness of at least approximately 1 nm and at most approximately 2.5 nm using, for example, the CVD method. At this time, the silicon oxide film is formed such that a top surface of the tunnel insulating film 2A of the memory cell is almost aligned with the top surface of the gate insulating film 2A of the low-breakdown-voltage transistor and the top surface of the upper gate insulating film 2A of the high-breakdown-voltage transistor.

If the lower gate insulating film 2C and the lowermost silicon oxide film 21 making up the tunneling insulating film 2A are formed using the thermal oxidation method, an interface between the lower gate insulating film 2C and the silicon oxide film 21 on the lower gate insulating film 2C may fail to be clearly observed using a scanning electro microscope (SEM) or a transmission electron microscope (TEM). That is, the structure is observed in which the high-dielectric insulating film and the silicon oxide film are sequentially laminated on the lower gate insulating film 2C, containing the lowermost silicon oxide film 21. Of course, the thus configured gate insulating film also applies to the present example.

After the step shown in FIG. 35, steps similar to those shown in FIGS. 8 to 13 are used to sequentially form a gate electrode, a source/drain diffusion layer, and the like.

The above-described steps complete a nonvolatile semiconductor device illustrated in the first applied example of the present embodiment.

Thus, with the nonvolatile semiconductor memory according to the present applied example, the case in which the present invention is applied to the memory chip including the peripheral transistors exerts effects similar to those of the case in which the present invention is applied to the memory cell according to the embodiments.

(4-2) Second Applied Example

A second applied example of the present embodiment will be described below with reference to FIGS. 36 to 40. The same members as those in the above-described first example are denoted by the same reference numerals. Details of these members will be described as required.

(a) Structure

Figure 36:
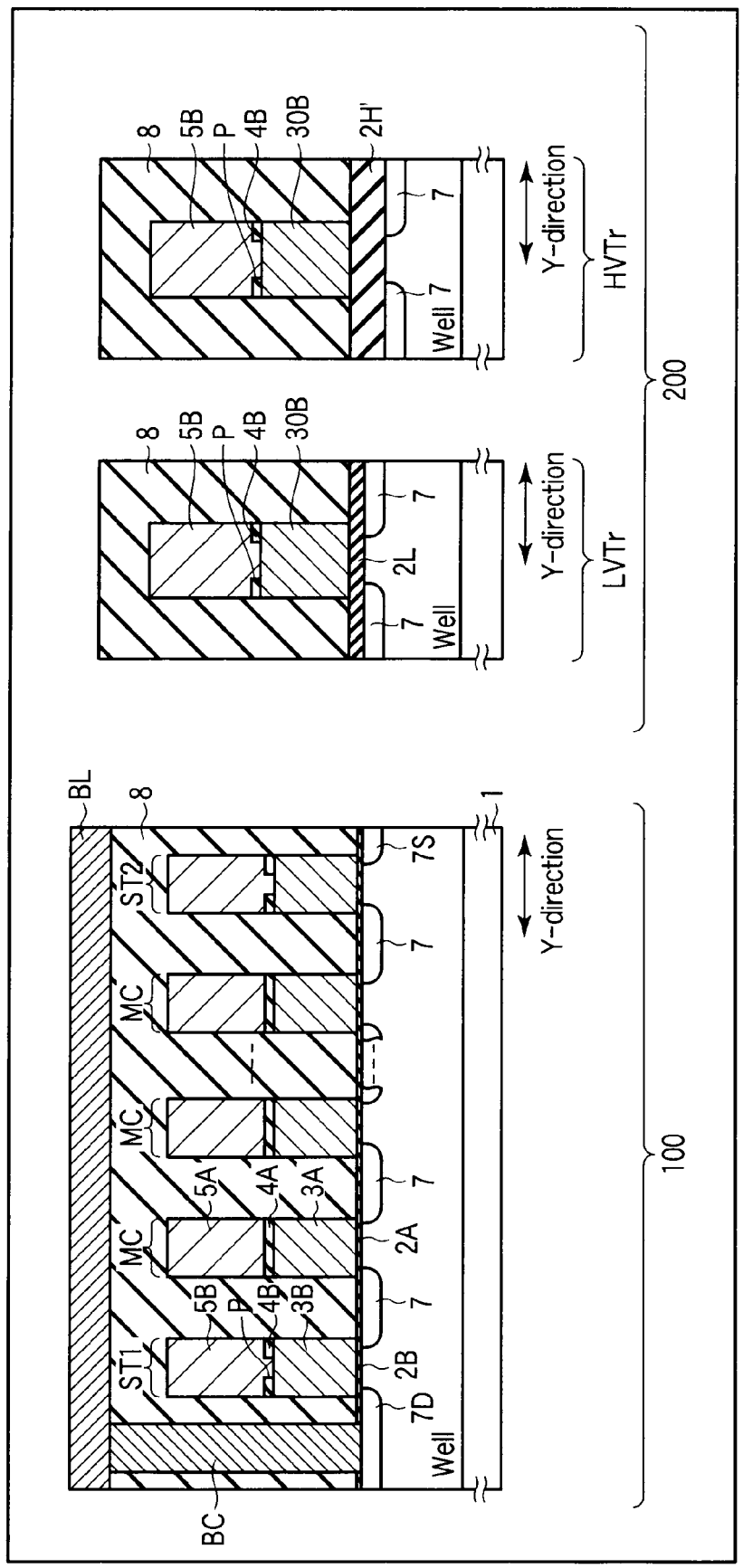
FIG. 36 is a diagram illustrating a structure in a second applied example.

A structure of a nonvolatile semiconductor memory according to the second applied example will be described with reference to FIG. 36.

The present example differs from the first applied example in that the structure of a gate insulating film 2L of the low-breakdown-voltage transistor LVTr is different from that of the tunnel insulating film 2A of the memory cell.

A silicon oxide film of for example, thickness 5 to 10 nm is used as the gate insulating film 2L of the low-breakdown-voltage transistor LVTr.

In the present example, the tunnel insulating film 2A is not laminated on a gate insulating film 2H' of the high-breakdown-voltage transistor HVTr. Gate electrodes 30B and 5B are formed on the gate insulating film 2H' of a single layer structure. The gate insulating film 2H' is made up of, for example, a silicon oxide film and is 35 to 50 nm in film thickness. Here, the single layer structure refers to the structure in which the tunnel insulating film 2A is not laminated on the gate insulating film 2H'. Examples of the gate insulating film 2H' of the single layer structure include the gate insulating film 2H' composed of a silicon oxide film and the surface of which is formed into a silicon oxynitride film by nitridization and the gate insulating film 2H' composed of the silicon oxide film formed through at least two steps.

In the present example, the lower gate electrode 30B of each of the peripheral transistors LVTr and HVTr is formed in a step different from the one in which the floating gate electrode 3A is formed.

Thus, when the structure and material of the gate insulating film 2L of the low-breakdown-voltage transistor LVTr are different from those of the tunnel insulating film of the memory cell, the gate insulating film 2L can be formed independently so as to meet characteristics required for the low-breakdown-voltage transistor.

As a result, according to the present applied example, the case in which the present invention is applied to the memory chip including the peripheral transistors exerts effects similar to those of the case in which the present invention is applied to the memory cell according to the embodiments. Additionally, the degree of freedom for device design can be improved.

(b) Manufacturing Method

Now, a method of manufacturing a nonvolatile semiconductor memory according to the second applied example will be described.

Figure 37:
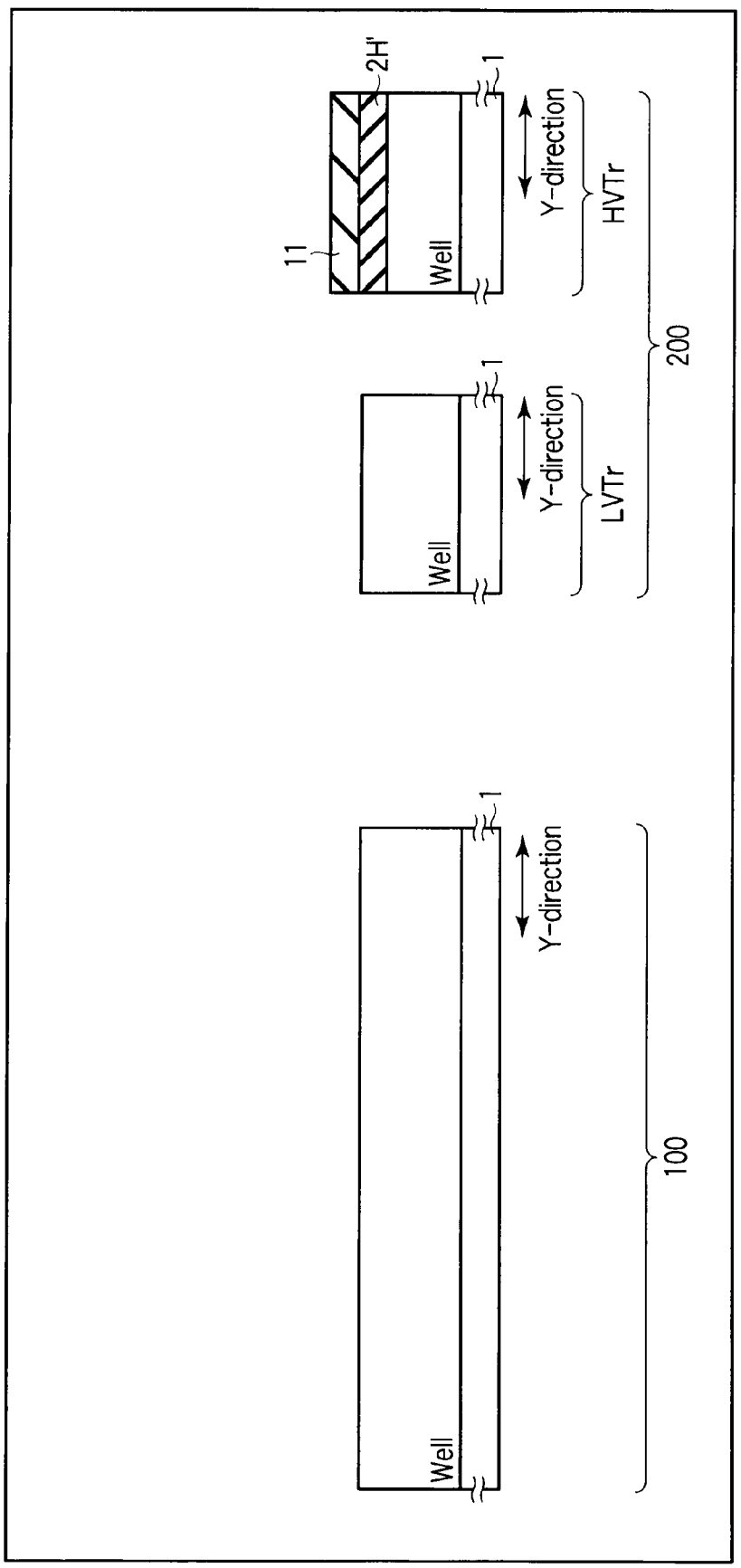
FIG. 37 is a diagram illustrating a manufacturing method in the second applied example.

As shown in FIG. 37, as is the case with FIGS. 32 to 34, a well region Well is formed in the semiconductor substrate 1. Then, a mask material is formed in the memory cell array 100 and low-breakdown-voltage transistor formation region LVTr on the semiconductor substrate 1. The semiconductor substrate 1 is thereafter etched in the high-breakdown-voltage transistor formation region HVTr. The depth by which the semiconductor substrate is etched is adjusted such that the top surface of the gate insulating film of the low-breakdown-voltage transistor, formed in the subsequent step, is located at almost the same height of the top surface of the gate insulating film of the high-breakdown-voltage transistor. The semiconductor substrate 1 in the low-breakdown-voltage transistor formation region LVTr may be further etched so that in addition to the top surfaces of the gate insulating films of the low- and high-breakdown-voltage transistors, the top surface of the tunnel insulating film, formed in the memory array, is also located at almost the same height as that of the top surface of the gate insulating film of the peripheral transistor.

The mask material is removed from the memory cell array 100 and low-breakdown-voltage transistor formation region LVTr on the semiconductor substrate 1. The gate insulating film 2H' of the high-breakdown-voltage transistor HVTr is formed in the memory cell array 100 and the peripheral circuit region 200.

Subsequently, the mask layer 11 is formed on the insulating film 2H' in the high-breakdown-voltage transistor formation region HVTr. The insulating film is then removed from the memory cell array 100 and the low-breakdown-voltage transistor formation region LVTr.

The mask layer 11 is removed. As shown in FIG. 38, the insulating film 2L is formed on the surface of the semiconductor substrate 1 in the exposed memory cell array 100 and low-breakdown-voltage transistor formation region LVTr, using, for example, the thermal oxidation method. The film thickness of the insulating film 2L is smaller than that of the gate insulating film 2H'. The insulating film 2L serves as the gate insulating film 2L of the low-breakdown-voltage transistor LVTr. However, formation of the gate insulating film 2L of the low-breakdown-voltage transistor LVTr increases the film thickness of the gate insulating film 2H' of the high-breakdown-voltage transistor HVTr by an amount equivalent to the film thickness of the gate insulating film 2L.

Then, the polysilicon film 30 is formed on the insulating films 2L and 2H' using, for example, the CVD method.

Figure 39:
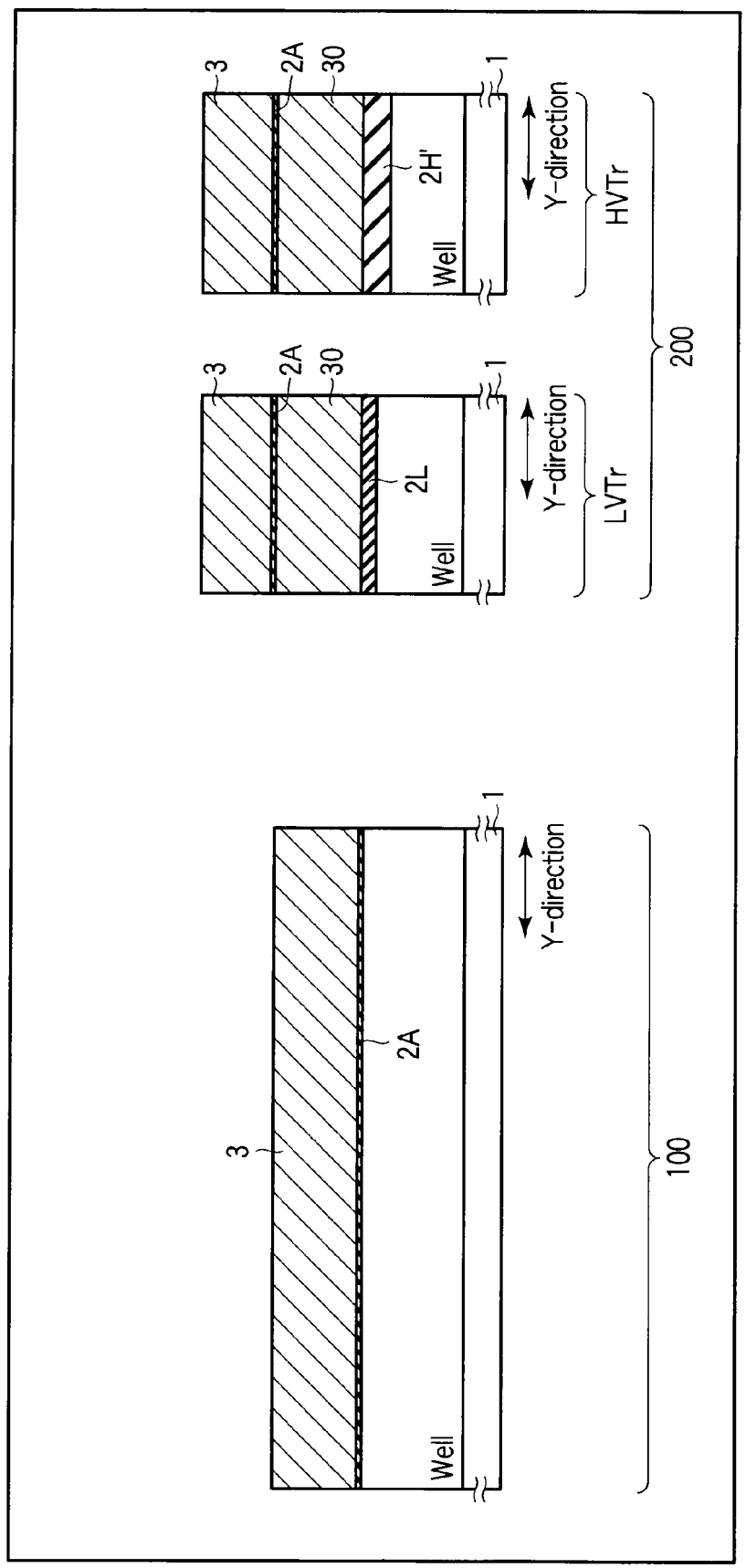
FIG. 39 is a diagram illustrating the manufacturing method in the second applied example.

As shown in FIG. 39, the silicon oxide film and the polysilicon film are removed from the memory cell array 100 using the lithography technique and the RIE method. A technique similar to the step shown in FIG. 35 is used to form the tunnel insulating film 2A of the laminate structure on the semiconductor substrate 1 in the memory cell array 100. The tunnel insulating film 2A is composed of, for example, a silicon oxide film, a high-dielectric insulating film, and a silicon oxide film. In this case, in the peripheral circuit region 200, the tunnel insulating film 2A of the laminate structure is formed on the polysilicon film 30.

After the tunnel insulating film 2A of the laminate structure is formed, the polysilicon film 3 is deposited in the memory cell array 100 and the peripheral circuit region 200. The polysilicon film 3 serves as a floating gate electrode of a memory cell.

As shown in FIG. 40, the polysilicon film 3 and the insulating film 2A are removed from the peripheral circuit region 200. In the step shown in FIG. 40, by locating the top surface of the polysilicon film 3 in the memory cell array 100 at the same height as that of the top surface of the polysilicon film 3 in the peripheral circuit region 200, the upper end of the memory cell array 100 and the upper end of the peripheral circuit region 200 are more properly flattened. Processing margins in a step shown in FIG. 40 and subsequent steps can be improved. Thus, in the peripheral circuit region 200, the polysilicon film 30 serves as a gate electrode. In the memory cell array 100, the polysilicon film 3, formed separately from the gate electrodes of the peripheral transistors, serves as a floating gate electrode.

After the step shown in FIG. 40, steps similar to those shown in FIGS. 8 to 13 are used to sequentially form a gate electrode, a source/drain diffusion layer, and the like.

The above-described steps complete a nonvolatile semiconductor device illustrated in the second applied example of the present embodiment.

Thus, with the nonvolatile semiconductor memory according to the present applied example, the case in which the present invention is applied to the memory chip including the peripheral transistors exerts effects similar to those of the case in which the present invention is applied to the memory cell according to the embodiments.

3. OTHER EXAMPLES

Examples of the present invention reduce the driving voltage of the memory cell and in the possible leakage current in the memory cell. The examples also allow the inter-gate insulating film (block insulating film) to be thinned. This improves the coupling ratio of the memory cell.

The description of the first to third embodiments and applied examples of the present invention relates to the NAND flash memory by way of example. However, the examples of the present invention are not limited to this aspect. Effects similar to those of the embodiments of the present invention are also exerted by applying the examples of the present invention to, for example, a NOR flash memory or an AND flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a memory cell including:
an element region partitioned by an isolation region in a semiconductor substrate;
a first gate insulating film contacting to the element region;
a charge storage layer contacting to the first gate insulating film;
a multilayer insulator contacting to the charge storage layer; and
a control gate electrode contacting to the multilayer insulator, the first gate insulating film including:
a first tunnel film;
a first high-dielectric-constant film contacting to the first tunnel film and having a greater dielectric constant than the first tunnel film; and
a second tunnel film contacting to the first high-dielectric-constant film and having the same configuration as that of the first tunnel film,
the multilayer insulator including:
a first insulating film;
a second high-dielectric-constant film contacting to the first insulating film and having a greater dielectric constant than the first insulating film; and
a second insulating film contacting to the second high-dielectric-constant film and having the same configuration as that of the first insulating film,
wherein a dielectric constant of the second high-dielectric-constant film is greater than a dielectric constant of the first high-dielectric-constant film,
wherein a thickness of the first tunnel film is smaller than a thickness of the first insulating film,
a thickness of the second tunnel film is smaller than a thickness of the second insulating film, and
a thickness of the first high-dielectric-constant film is smaller than a thickness of the second high-dielectric-constant film.

2. The nonvolatile semiconductor memory according to claim 1, wherein the multilayer insulator further includes a third insulating film having a greater dielectric constant than the first insulating film and a smaller dielectric constant than the second high-dielectric-constant film, at least one of between the charge storage layer and the first insulating film and between the second insulating film and the control gate electrode.

3. The nonvolatile semiconductor memory according to claim 1, wherein the first and second tunnel films and the first and second insulating films each comprise a silicon oxide film.

4. The nonvolatile semiconductor memory according to claim 1, wherein the first high-dielectric-constant film is a high-dielectric material containing at least one of aluminum, hafnium, lanthanum, and tantalum.

5. The nonvolatile semiconductor memory according to claim 1, wherein the charge storage layer is a conductive layer.

6. The nonvolatile semiconductor memory according to claim 1, wherein the charge storage layer is an insulating layer with an electron trap level.

7. The nonvolatile semiconductor memory according to claim 1, further comprising a selection transistor,
the selection transistor including:
a second gate insulating film provided on the semiconductor substrate and having the same configuration as that of the first gate insulating film;
a first lower gate electrode layer provided on the second gate insulating film and having the same configuration as that of the charge storage layer;
a first insulator provided on the first lower gate electrode layer and having the same configuration as that of the multilayer insulator; and
a first upper gate electrode layer provided on the first insulator and connected to the lower gate electrode layer via an opening formed in the first insulator.

8. The nonvolatile semiconductor memory according to claim 1, further comprising a low-breakdown-voltage transistor and a high breakdown voltage selection transistor;

the low-breakdown-voltage transistor including:
a third gate insulating film provided on the semiconductor substrate;
a second lower gate electrode layer provided on the third gate insulating film;
a second insulator provided on the second lower gate electrode layer and having the same configuration as that of the first insulator; and
a second upper gate electrode layer provided on the second insulator and connected to the second lower gate electrode layer via an opening formed in the second insulator,
the high-breakdown-voltage transistor including:
a fourth gate insulating film provided on the semiconductor substrate;
a third lower gate electrode layer provided on the fourth gate insulating film;
a third insulator provided on the third lower gate electrode layer and having the same configuration as that of the first insulator; and
a third upper gate electrode layer provided on the third insulator and connected to the third lower gate electrode layer via an opening formed in the third insulator.

9. The nonvolatile semiconductor memory according to claim 1, wherein the dielectric constant of the first high-dielectric-constant film is greater than a dielectric constant of a silicon nitride film.

10. The nonvolatile semiconductor memory according to claim 1, wherein the first and second tunnel films each have thickness such that electrons perform direct tunneling.

11. The nonvolatile semiconductor memory according to claim 1, wherein the first high-dielectric-constant film is provided between the first tunnel film and the second tunnel film, and the second high-dielectric-constant film is provided between the first insulating film and the second insulating film.

12. The nonvolatile semiconductor memory according to claim 6, wherein only a top surface of the charge storage layer is in contact with the multilayer insulator.

13. The nonvolatile semiconductor memory according to claim 6, wherein the charge storage layer extends from the element region onto the isolation region.

14. The nonvolatile semiconductor memory according to claim 6, wherein an upper end of the charge storage layer is located at the same position as that of an upper end of the isolation insulating film provided in the isolation region.

15. The nonvolatile semiconductor memory according to claim 6, wherein an upper end of the multilayer insulator is located closer to the semiconductor substrate than the upper end of the isolation insulating film provided in the isolation region.

16. The nonvolatile semiconductor memory according to claim 8, wherein the third gate insulating film has the same configuration as that of the first gate insulating film.

17. The nonvolatile semiconductor memory according to claim 8, wherein film thickness of the third gate insulating film is greater than that of the first gate insulating film.

18. The nonvolatile semiconductor memory according to claim 8, wherein film thickness of the fourth gate insulating film is greater than that of the third gate insulating film.

19. The nonvolatile semiconductor memory according to claim 8, wherein the fourth gate insulating film comprises a lower gate insulating film provided on the semiconductor substrate and having film thickness than that of the third gate insulating film, and an upper gate insulating film laminated on the lower gate insulating film and having the same configuration as that of the first gate insulating film.

20. The nonvolatile semiconductor memory according to claim 8, wherein the second and third lower gate electrode layers have the same configuration as that of the first lower gate electrode layer.

21. The nonvolatile semiconductor memory according to claim 13, wherein the first high-dielectric-constant film is in direct contact with an isolation insulating film provided in the isolation region.

* * * * *